(12) United States Patent
Chen et al.

(10) Patent No.: US 8,269,671 B2
(45) Date of Patent: *Sep. 18, 2012

(54) SIMPLE RADIO FREQUENCY INTEGRATED CIRCUIT (RFIC) PACKAGES WITH INTEGRATED ANTENNAS

(75) Inventors: Ho Chung Chen, Taipei (TW); Brian A. Floyd, Mahopac, NY (US); Duixian Liu, Scarsdale, NY (US)

(73) Assignees: International Business Machines Corporation, Armonk, NY (US); Media Tek, Hs in-Chu (TW)

( * ) Notice: Subject to any disclaimer, the term of this patent is extended or adjusted under 35 U.S.C. 154(b) by 757 days.

This patent is subject to a terminal disclaimer.

(21) Appl. No.: 12/360,538

(22) Filed: Jan. 27, 2009

(65) Prior Publication Data

US 2010/0190464 A1     Jul. 29, 2010

(51) Int. Cl.
  *H01Q 1/24*     (2006.01)
(52) U.S. Cl. ............. 343/700 MS; 343/873; 343/850; 343/853; 343/893
(58) Field of Classification Search ........... 343/700 MS, 343/872, 873, 893, 850, 853
  See application file for complete search history.

(56) References Cited

U.S. PATENT DOCUMENTS

| | | | |
|---|---|---|---|
| 5,903,239 A | 5/1999 | Takahashi et al. | |
| 6,421,012 B1 | 7/2002 | Heckaman | |
| 6,809,688 B2 | 10/2004 | Yamada | |
| 6,906,668 B2 | 6/2005 | Rawnick et al. | |
| 7,084,828 B2 | 8/2006 | Rawnick et al. | |
| 7,095,372 B2 | 8/2006 | Soler Castany et al. | |
| 7,119,745 B2 | 10/2006 | Gaucher et al. | |
| 7,176,506 B2 | 2/2007 | Beroz et al. | |
| 7,312,763 B2 | 12/2007 | Mohamadi | |
| 7,321,339 B2 | 1/2008 | Mohamadi | |
| 7,329,950 B2 | 2/2008 | Khorram | |
| 7,372,408 B2 | 5/2008 | Gaucher et al. | |
| 7,728,774 B2 * | 6/2010 | Akkermans et al. | ... 343/700 MS |
| 2002/0007468 A1 | 1/2002 | Kampe et al. | |
| 2006/0276157 A1 | 12/2006 | Chen et al. | |
| 2007/0026567 A1 | 2/2007 | Beer et al. | |
| 2007/0063056 A1 | 3/2007 | Gaucher et al. | |
| 2007/0103380 A1 | 5/2007 | Weste | |

(Continued)

OTHER PUBLICATIONS

U.S. Appl. No. 12/494,671, filed Jun. 30, 2009, titled, Compact Millimeter Wave Packages with Integrated Antennas.

(Continued)

*Primary Examiner* — Dieu H Duong
(74) *Attorney, Agent, or Firm* — Ryan, Mason & Lewis, LLP

(57) ABSTRACT

A radio-frequency integrated circuit chip package has N integrated patch antennas, N being at least one. The package includes a cover portion with N generally planar patches, and a main portion coupled to the cover portion. The main portion in turn includes at least one generally planar ground plane spaced inwardly from the N generally planar patches and parallel thereto. The ground plane is formed without any coupling apertures therein. The main portion also includes N feed lines spaced inwardly from the N generally planar patches and parallel thereto, and spaced outwardly from the generally planar ground plane and parallel thereto. Furthermore, the main portion includes at least one radio frequency chip coupled to the feed lines and the ground plane. The cover portion and the main portion cooperatively define an antenna cavity, and the N generally planar patches and the chip are located in the antenna cavity. The package is formed without reflectors. Fabrication techniques are also described.

24 Claims, 31 Drawing Sheets

U.S. PATENT DOCUMENTS

2007/0111388 A1    5/2007   Karnezos
2008/0029886 A1    2/2008   Cotte et al.
2008/0105966 A1    5/2008   Beer et al.
2008/0122726 A1    5/2008   Levi et al.

OTHER PUBLICATIONS

U.S. Appl. No. 12/034,023, filed Feb. 20, 2008 titled "Radio Frequency (RF) Integrated Circuit (IC) Packages with Integrated Aperture Coupled Patch Antenna(s)."

U.S. Appl. No. 12/102,051, filed Apr. 14, 2008 titled "Radio Frequency (RF) Integrated Circuit (IC) Packages with Integrated Aperture-Coupled Patch Antenna(s) in Ring and/or Offset Cavities."

Kenneth K. O, et al., "On-Chip Antennas in Silicon ICs and Their Application", IEEE Transactions on Electronic Devices, vol. 52, No. 7, Jul. 2005.

Byung-Wook Min, et al., "A Low-Loss Silicon-on-Silicon DC-110-GHz Resonance-Free Package", IEEE Transactions on Microwave Theory and Techniques, vol. 54, No. 2, Feb. 2006.

David M. Pozar, "A Review of Aperture Coupled Microstrip Antennas: History, Operation, Development, and Applications," University of Massachusetts, Amherst, MA, May 1996.

Zwick et al., "Broadband Planar Millimeter Wave Dipole with Flip-Chip Interconnect," Invited, Proceedings of the 2007 IEEE AP-S International Symposium, pp. 5047-5050, Honolulu, Hawaii, Jun. 10-15, 2007.

Zwick et al., "Broadband Planar Superstrate Antenna for Integrated Millimeterwave Transceivers," IEEE Transactions on Antennas and Propagation, vol. 54, No. 10, Oct. 2006.

U.S. Appl. No. 12/045,377, filed Mar. 10, 2008 titled "Wafer-Scale Phased Array".

U.S. Appl. No. 12/130,562, filed May 30, 2008, titled "Method and Apparatus for Packaging an Integrated Chip and Antenna".

U.S. Appl. No. 12/168,328, filed Jul. 7, 2008, titled "Radio Frequency (RF) Integrated Circuit (IC) Packages Having Characteristics Suitable for Mass Production".

Liu et al., Design Consideration for Millimeter Wave Antennas within a Chip Package, T.J. Watson Research Center, IBM, Yorktown Heights, New York, USA, 2007.

Industrial R&D in Optics and Microelectronics, A Swedish ICT Research Company, www.acreo.se.

Ojefors et al., Integrated Antennas, Monolithic and Hybrid Approaches, Digital Comprehensive Summaries of Uppsala Dissertations from the Faculty of Science and Technology 221, Uppsala Universitet, 2006.

Erickson et al., Integrated Circuit Active Phased Array Antennas for Millimeter Wave Communications Applications, Boeing Defense & Space Group, Seattle, Washington, 1994.

\* cited by examiner

SIMPLE RADIO FREQUENCY INTEGRATED CIRCUIT (RFIC) PACKAGES WITH INTEGRATED ANTENNAS

FIELD OF THE INVENTION

The present invention generally relates to communications circuitry, and, more particularly, to radio frequency (RF) integrated circuit (IC) packages.

BACKGROUND OF THE INVENTION

In a wireless network, the connectivity and communication between devices is achieved through antennas attached to receivers or transmitters, in order to radiate the desired signals to or from other elements of the network. In radio communication systems, such as millimeter-wave radios, discrete components are usually assembled with low integration levels. These systems are often assembled using expensive and bulky waveguides and package-level or board-level microstrip structures to interconnect semiconductors and their required transmitter- or receiver-antennas. With recent progress in semiconductor technology and packaging engineering, the dimensions of these radio communication systems have become smaller. For applications such as wireless universal serial bus (USB), the operating distance is limited to about a meter; and a single antenna with about 7 dBi at 60 GHz will provide the necessary antenna gain. For distances as long as 10 meters (such as wireless video) or longer (such as radar), in point-to-point applications, antenna gains as high as 30 dBi, depending on the application, are required. However, high gain antennas for wireless video applications have very narrow beam widths, so pointing the antenna is very difficult for consumers. Therefore, a radiation pattern steerable array, such as a phased array, is necessary. Phased arrays are also widely used in military radars. However, packaging RF chips with integrated antennas or phased arrays is extremely difficult and very expensive due to the expensive components and extensive labor involved.

SUMMARY OF THE INVENTION

Principles of the present invention provide techniques for simple radio frequency integrated circuit (RFIC) packages with integrated antennas.

In an exemplary embodiment, according to one aspect of the invention, a radio-frequency integrated circuit chip package has N integrated patch antennas, N being at least one. The package includes a cover portion with N generally planar patches, and a main portion coupled to the cover portion. The main portion in turn includes at least one generally planar ground plane spaced inwardly from the N generally planar patches and parallel thereto. The ground plane is formed without any coupling apertures therein. The main portion also includes N feed lines, the N feed lines being spaced inwardly from the N generally planar patches and parallel thereto, the N feed lines being spaced outwardly from the generally planar ground plane and parallel thereto. Furthermore, the main portion includes at least one radio frequency chip coupled to the feed lines and the ground plane. The cover portion and the main portion cooperatively define an antenna cavity, and the N generally planar patches and the chip are located in the antenna cavity. The package is formed without reflectors.

In another aspect, a method of fabricating a radio-frequency integrated circuit chip package with N integrated patch antennas, N being at least one, includes providing a cover portion and a main portion as just described, and securing the cover portion to the main portion.

In some embodiments of the package and the method, N is two or more, and thus, a phased array can be formed.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments of the invention provide an apparatus and method for low cost packages with integrated antennas and phased arrays operating in the millimeter wave (mmWave) range. An exemplary inventive package with integrated antennas is based on a multilayer printed circuit board (PCB). The package contains, for example, a rectangular or ring cavity for implementing high performance antenna(s) or antenna arrays and another cavity housing mmWave radio frequency (RF) integrated circuit chips. One or more embodiments of the invention also provide techniques to overcome the difficulties in making internal cavities and to avoid the need to employ wire bond technology at mmWave frequencies. Embodiments of the inventive packaging technology are consistent with the PCB manufacturing process and can be used for packages with an integrated antenna or antenna array.

Instances of the invention thus provide low cost packaging with integrated antennas or planar phased arrays; in particular, chip packaging with integrated antennas or planar phased array designs for mmWave frequencies and above.

Typical chip packages with integrated antennas have three major parts: (i) an RF chip, (ii) one or more antennas, and (iii) a package carrier (and in some instances, a package lid or cover, or an encapsulant to protect the package). One or more embodiments of the invention provide a package that has high performance antennas, an interface for flip-chipping an RF chip and an interface for flip-chipping the package to a printed circuit mother board.

Figure 1:
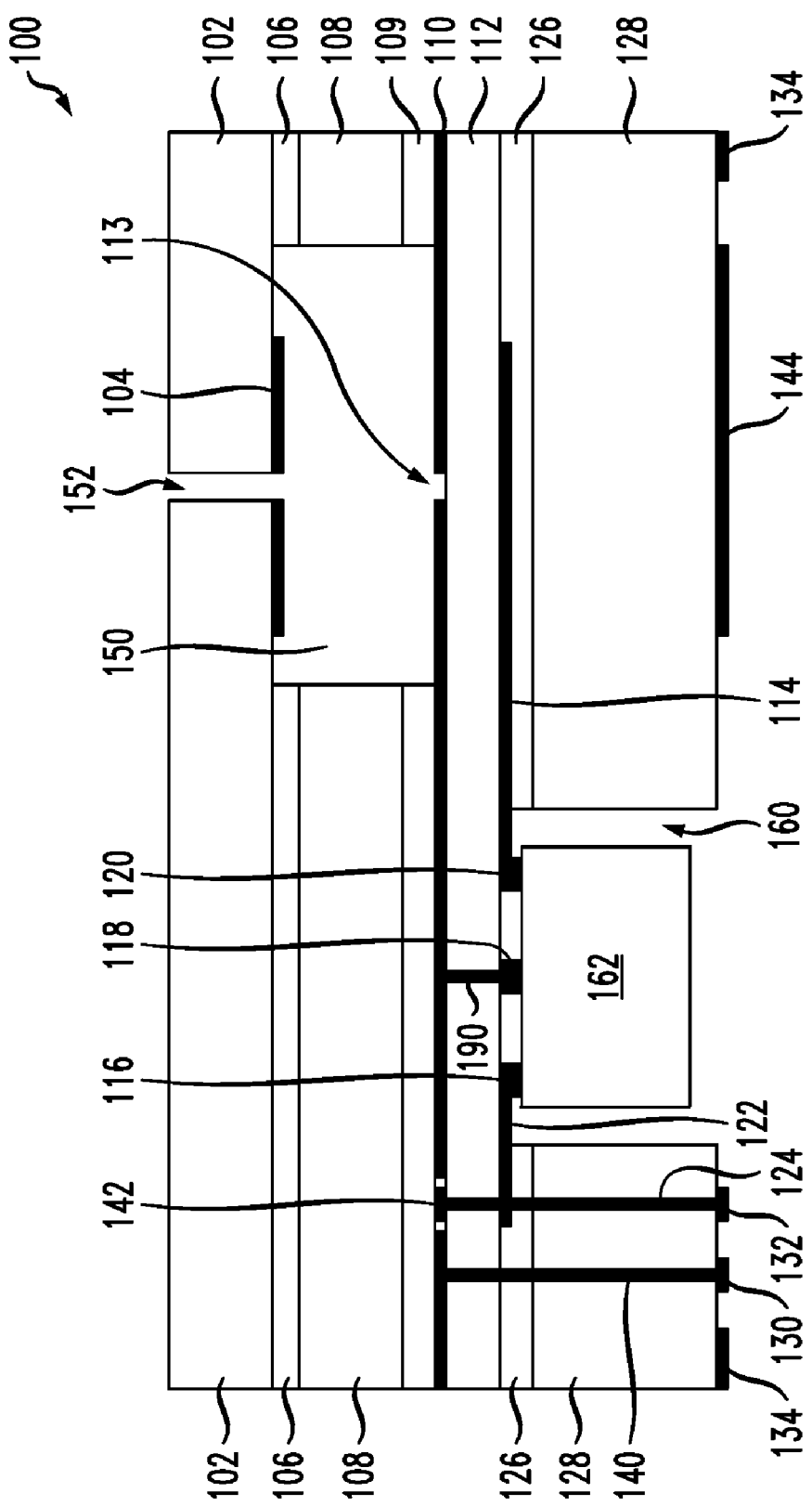
FIG. 1 shows an exemplary embodiment of a package, in cross section, according to an aspect of the invention.

FIG. 1 shows a cross-sectional view of an exemplary package 100, according to an aspect of the invention. Note that section lining is omitted throughout the figures, for clarity. The package has seven total layers, including substrate and bounding layers. For mmWave applications, especially for frequencies above 60 GHz, bounding film and/or layer thickness has to be considered in the design process. Given the teachings herein, a person having ordinary skill in the antenna and packaging arts will know how to take the thickness into account and how to employ high precision PCB fabrication techniques to make embodiments of the invention. The package 100 also has a number of metal layers. In particular, there is an outermost substrate 102. Immediately inward therefrom is a metal layer used for the patch(es) 104 of the patch antenna(s). Inward of the substrate 102 and patch antenna 104 (only a single antenna is depicted in FIG. 1, but more can be provided as discussed below) are a bound film layer 106, another substrate layer 108, and another bound film layer 109. Another metal layer, inward of bound film 109, is used for the ground plane 110 of the patch antenna. Slot(s) 113 on the ground plane are used for the apertures of the aperture-coupled patch antennas. The ground plane 110 also separates the radiating elements (patches) 104 from the feed line(s) and the RF chip(s), discussed below.

Another substrate 112 is inward from ground plane 110. Another metal layer is inward from substrate 112 and is used to implement the antenna feed line(s) 114, pads 116, 118, 120 for RF chip connections (preferably a flip-chip/C4 ("controlled collapse chip connection") type of connection), and interconnection(s) 122 (as appropriate) to one or more vias, such as via 124, in a further bound film layer 126 inward of the metal layer forming feed line 114, and a further substrate 128 inward of bound film 126. A still further metal layer provides all the pads for signal, control, power supply, and ground connections to the mother PCB (the mother PCB is omitted from the figure for clarity). Pads may include ground pad 130 interconnected with ground plane 110 through ground via 140, as well as one or more of signal, power, and control pads exemplified by pad 132 connected to interconnection 122 and antipad 142 by via 124. The vias may be, for example, plated through holes. Package pads 134 may also be provided. Depending on the patch antenna design, an optional reflector 144 can also be implemented on the same metal layer as the pads 130, 132, 134. In some instances, as discussed below, the reflector 144 is embedded.

To implement the flip-chip approach, the chip 162 preferably has a plurality of solder dots connected directly to the chip connection pads 116, 118, 120.

To enhance the patch antenna bandwidth, patches may be air suspended or supported with a foam material with a dielectric constant close to one at low frequency applications. However, at mmWave frequencies, especially for package applications, air suspended or foam supported patches are not realistic. Thus, in one or more embodiments of the invention, an air cavity 150 can be implemented in the packages. To avoid issues from hot gases during the PCB manufacturing process, vent hole(s) 152 can be employed. These holes can be designed such that they have little effect on the antenna performance. For example, hole 152 can be located near the middle of the cavity 150 or close to the edge of the cavity 150, and can be made relatively small, consistent with adequate venting. The vent holes can be on the top (outermost part of) the cavity 150 as shown in FIG. 1 or on the side of the cavity as discussed below, depending on the manufacturing process used.

The ground plane 110 is also used for making ground connections through vias (e.g., via 140) and signal, power, and control connections through vias and antipads (e.g., via 124 with antipad 142, illustrative of a via with antipad that could be used for signal, power, or control functionality). Antipads are beneficial from a manufacturing standpoint, and result in increased reliability, as it is difficult to achieve reliability in partial vias (i.e., vias such as via 124 that do not extend completely through a structure) without use of antipads.

An open chip-receiving cavity or socket 160 is realized in the substrate 128 and bound film 126. This socket is used to hold the RF chip 162. The chip is attached to the package through flip-chip bonding.

Note that all the mmWave components (antennas, power amplifiers, low noise amplifiers, and the like) are in the package 100. Vias 124, 140 are used to pass through DC or much lower frequency signals.

The package 100 may advantageously be attached to the mother board (not shown) through a ball grid array (BGA).

Figure 2:
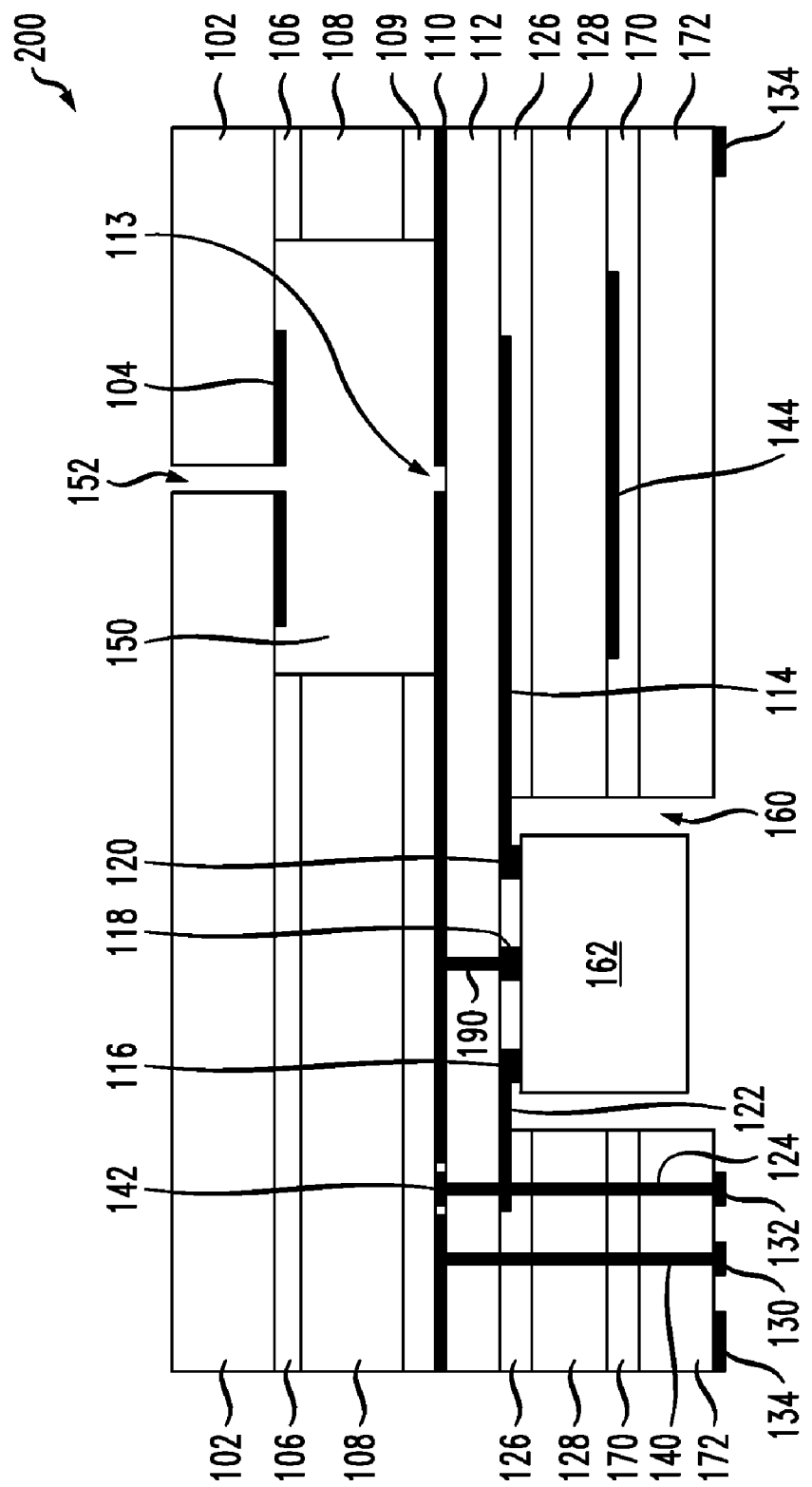
FIG. 2 shows an exemplary embodiment of another package, in cross section, according to another aspect of the invention.

FIG. 2 shows an embodiment 200 substantially similar to embodiment 100 except that reflector 144 is encapsulated by an additional bound layer 170 inward of reflector 144 and an additional substrate 172 inward of bound layer 170. Similar items have received the same reference number and will not be described again. Chip receiving socket 160 is also formed in substrate 172 and bound layer 170 in this embodiment.

Figure 3:
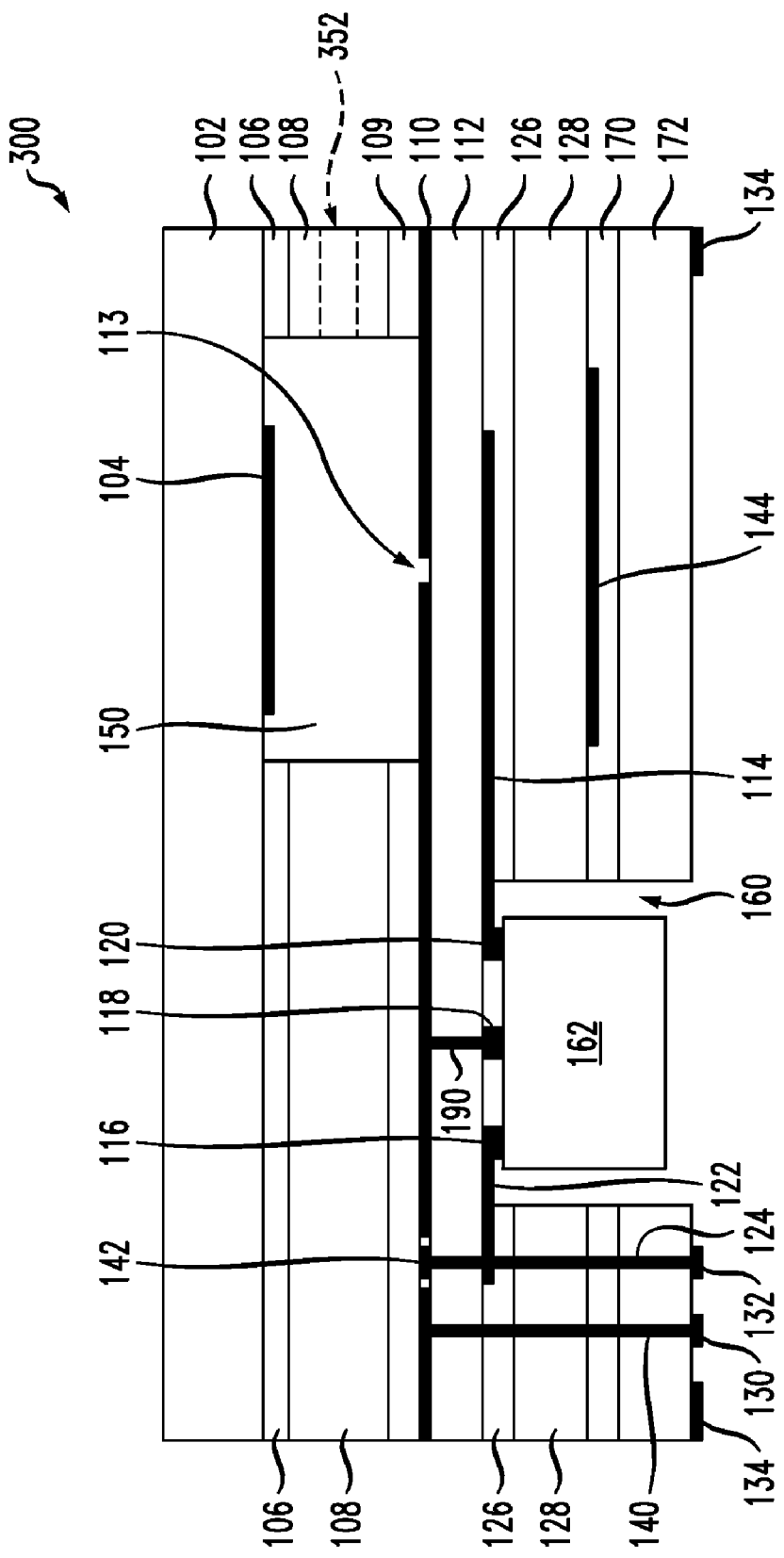
FIG. 3 shows an exemplary embodiment of yet another package, in cross section, according to yet another aspect of the invention.

FIG. 3 shows an embodiment 300 substantially similar to embodiment 200 except that vent 352 runs sideways through layer 108 so as to vent cavity 150. Similar items have received the same reference number and will not be described again.

Figure 4:
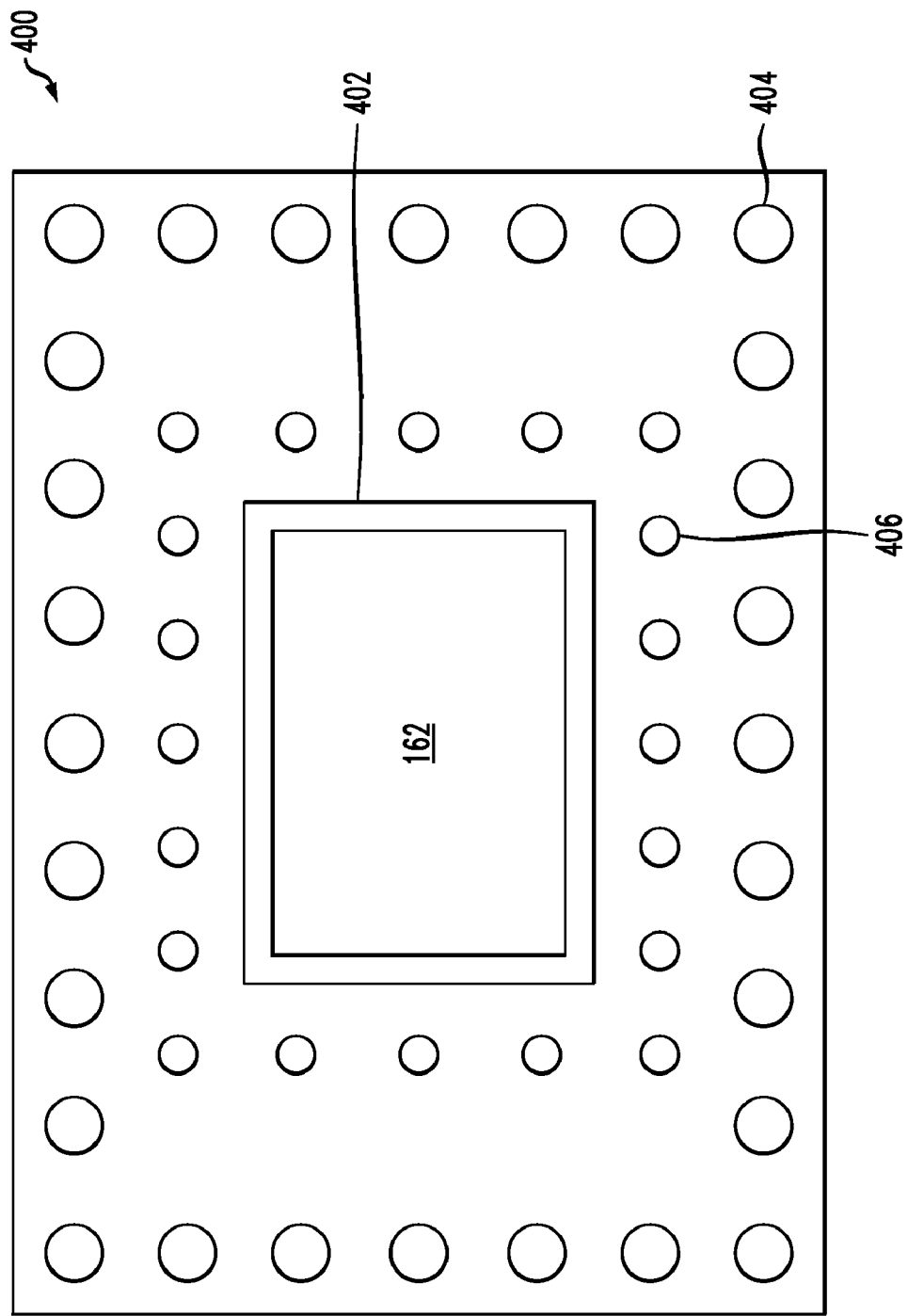
FIG. 4 is a bottom view of an exemplary package with no reflector or an embedded reflector.
Figure 5:
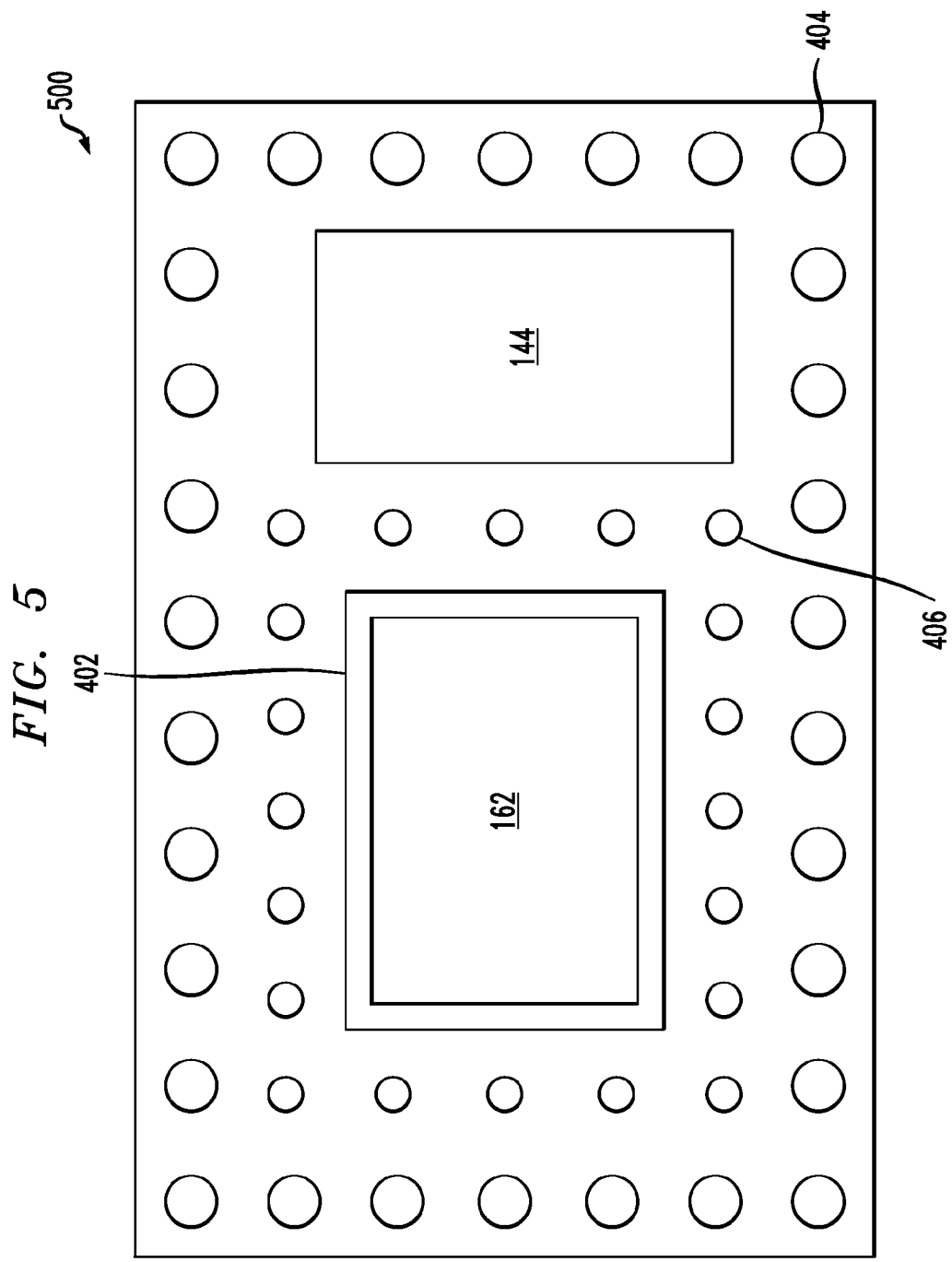
FIG. 5 is a bottom view of an exemplary package with a visible reflector.

FIG. 4 presents a bottom view 400 where chip 162 is encapsulated with encapsulant 402. The chip can be partially or completely encapsulated, for example, for purposes of resisting humidity. A plurality of outer pads 404 may correspond, for example, to attachment, heat conduction, or ground pads such as pad 130, while a plurality of inner pads 406 may correspond, for example, to signal, control, or power pads such as pad 132. In FIG. 4, there is no reflector or the reflector is embedded. FIG. 5 shows a view 500 similar to view 400 but of a package with a reflector 144, as in FIG. 1. Similar items have received the same reference number and will not be described again.

Figure 6:
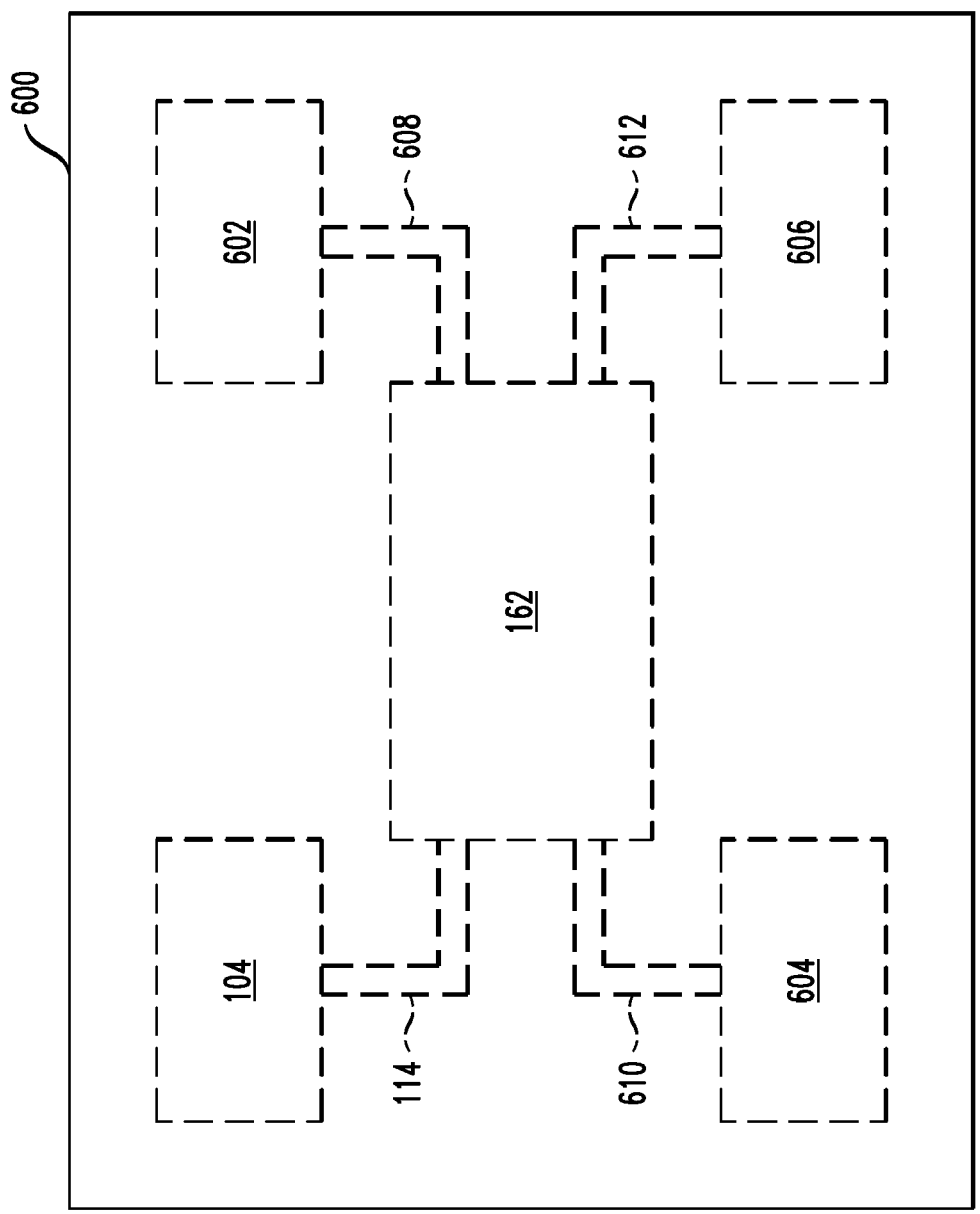
FIG. 6 is a bottom view of an exemplary planar phased array embodiment.

FIG. 6 shows an exemplary package 600 with a 2×2 planar phased array layout. It is possible to have more than two antennas on each row. This basic 2×2 array can be used to form much larger arrays. In addition to first antenna patch 104 with first feed line 114, also included are second, third and fourth antenna patches 602, 604, 606 with corresponding second, third and fourth feed lines 608, 610, 612. Each feed line is connected to chip 162 as described above. Although, for purposes of illustrative convenience, the feed lines are shown ending at the patches in FIG. 6, it will be appreciated that they may overlap the corresponding patches when viewed in top or bottom plan views, and are spaced from the corresponding patch and coupling aperture when viewed in cross-section as shown in FIGS. 1-3 (for example, one end of the feed line passes the center of the patch (FIG. 17) or stays at the center (FIG. 18). The other end of the feed line goes just past the edge of the RF chip).

It will thus be appreciated that aspects of the invention include a package with a socket for an RF chip, and a planar antenna. In one or more instances, the RF chip is flip-chip attached to the package. Internal cavities can be used to improve the patch bandwidth. Venting holes can be used to remove the hot gases during the PCB manufacturing process. The package can be attached to the mother PCB through a BGA. The package can implement a planar phased array.

In view of the discussion of FIGS. 1-6, it will be appreciated that, in general terms, an aperture-coupled patch antenna package, according to an aspect of the invention, can include at least one generally planar patch, such as patch 104. Also included is at least one generally planar ground plane, such as plane 110, spaced inwardly from the generally planar patch 104 and substantially parallel thereto. The ground plane is formed with at least one coupling aperture slot, such as slot 113, therein. The slot 113 is substantially opposed to the patch 104. At least one feed line, such as line 114, is spaced inwardly from the ground plane 110 and is substantially parallel thereto. At least one radio frequency chip, such as chip 162, is spaced inwardly from the feed line 114 and is coupled to the feed line 114 and the ground plane 110. Also included is a first substrate layer, such as that formed by bound film 126 and substrate 128, spaced inwardly from the feed line 114. The first substrate layer is formed with a chip-receiving cavity, such as cavity 160. The chip 162 is located in the chip-receiving cavity 160.

Given the description herein, a person skilled in the PCB and antenna arts can make embodiments of the invention. Non-limiting examples of materials that may be used include thermoset plastic/ceramic/woven glass or similar laminates such as the Rogers RO4000® series of materials (and other compatible materials) available from Rogers Corporation of Rogers, Conn. USA, as well as copper for metal layers, possibly gold-plated on pads or other exposed areas. Similar techniques can be used for all the depicted embodiments, including FIGS. 1-18.

It will be appreciated that advantageously, embodiments of the invention, such as 100, 200, and 300, provide a complete package and not a mere patch antenna separate from the chip and other packaging.

Note that vias such as 124, 140 may be formed, for example, using plated through holes.

Embodiments of the invention may also include a second substrate layer, such as that formed by substrate 108 and bound films 106, 109, interposed in a region between the ground plane 110 and a plane defined by the patch 104. The patch 104 may be advantageously formed in a first metal layer and the ground plane 110 may be advantageously formed in a second metal layer.

In one or more embodiments, a third substrate layer, such as that formed by substrate 112, is interposed in a region between the ground plane 110 and the feed line 114. The feed line 114 may be advantageously formed in a third metal layer. Further, one or more packages in accordance with embodiments of the invention may include at least one via, such as via 190, formed in the third substrate layer 112 and coupled to the ground plane 110. A plurality of chip connection pads, such as pads 116, 118, 120, can be formed in the third metal layer. At least one of the chip connection pads, such as 118, can be coupled to the at least one via 190 in the third substrate layer. The chip connection pads couple the chip to the feed line 114 (pad 120), the via 190 (pad 118) and the via 124 (pad 116).

One or more embodiments of the invention may include one or more signals pads, one or more control pads, and one or more power supply pads, all of which are exemplified by pad 132, as well as one or more ground pads, such as 130. The signal, control, power supply and ground pads are advantageously formed in a fourth metal layer. As noted, package pads 134 can optionally be provided.

Also included in one or more embodiments is at least one ground via, such as 140, coupling the ground plane 110 and the ground pad 130. The at least one ground via 140 passes through the first and third substrate layers (e.g., substrate 112, bound film 126, and substrate 128), in a region not intersecting the feed line 114. One or more embodiments include at least one each of power, signal, and control antipads, such as antipad 142, formed substantially coplanar with the ground plane 110. At least one signal via couples the signal antipad and the signal pad, and passes through the first and third substrate layers. Similarly, at least one power via couples the power antipad and the power pad, and passes through the first and third substrate layers. Furthermore, at least one control via couples the control antipad and the control pad, and passes through the first and third substrate layers. As noted, pad 132, via 124, and antipad 142 are illustrative of pad, via, and antipad elements that may be provided for power, signal, and control functionality.

As also noted, in some instances, a reflector, such as 144, is spaced inwardly from the third substrate layer and is generally opposed to the coupling aperture slot 113. The reflector can be located on an inner surface of the first substrate layer (e.g., inmost surface of substrate 128). The reflector can be exposed, as in FIG. 1, or embedded, as in FIGS. 2 and 3, in which case the package can include a fourth substrate layer, such as that formed by bound film 170 and substrate 172, spaced inwardly from the reflector 144. The reflector can thus be embedded between the first and fourth substrate layers.

Advantageously, the second substrate layer, such as that formed by films 106, 109 and substrate 108, is formed with an air cavity, such as cavity 150, therein. Air cavity 150 is located between the patch 104 and the coupling aperture slot 113 in the ground plane 110. Preferably, the air cavity is formed in communication with a vent, such as vent 152 or 352. In the latter case, as in FIG. 3, the vent 352 is formed in the second substrate layer; in particular, in substrate 108. In the former case, vent 152 is formed in an additional substrate layer, such as that formed by substrate 102, spaced outwardly from the patch 104. The patch is formed on the additional substrate layer 102, and the vent is formed in the additional substrate layer 102.

As noted with regard to FIG. 6, in one or more embodiments of the invention, two or more patches are implemented to form a planar phased array. Thus, in general terms, the above-discussed patch 104 may be designated as a first patch, and the above-discussed feed line 114 is a first feed line. The ground plane can be formed with one or more additional coupling aperture slots, like slot 113. The package can include one or more additional generally planar patches, such as patches 602, 604, 606, spaced outwardly from the ground plane. The additional slots can be substantially opposed to the additional patches. The package can also include one or more additional feed lines, such as lines 608, 610, 612, spaced inwardly from the ground plane and substantially parallel thereto. The at least one radio frequency chip 162 is coupled to the additional feed line(s) and the first patch and additional patch(es) are arranged to form a planar phased array. A single large ground plane with multiple slots can be employed in phased array embodiments. A phased array can include any number of patches greater than or equal to two; however, powers of two are advantageous, e.g., 2, 4, 8, 16, 32, and so on.

For array applications, the spacing between the antenna elements is approximately one-half of the free space wavelength (for example, about 2.5 mm at 60 GHz). Thus, it is challenging to implement multiple cavities for antennas, as the cavity wall is too thin. Embodiments of the invention which address this issue will be discussed with regard to FIGS. 7-18. One or more of such embodiments advantageously provide ease of fabrication in the case of arrays.

Figure 7:
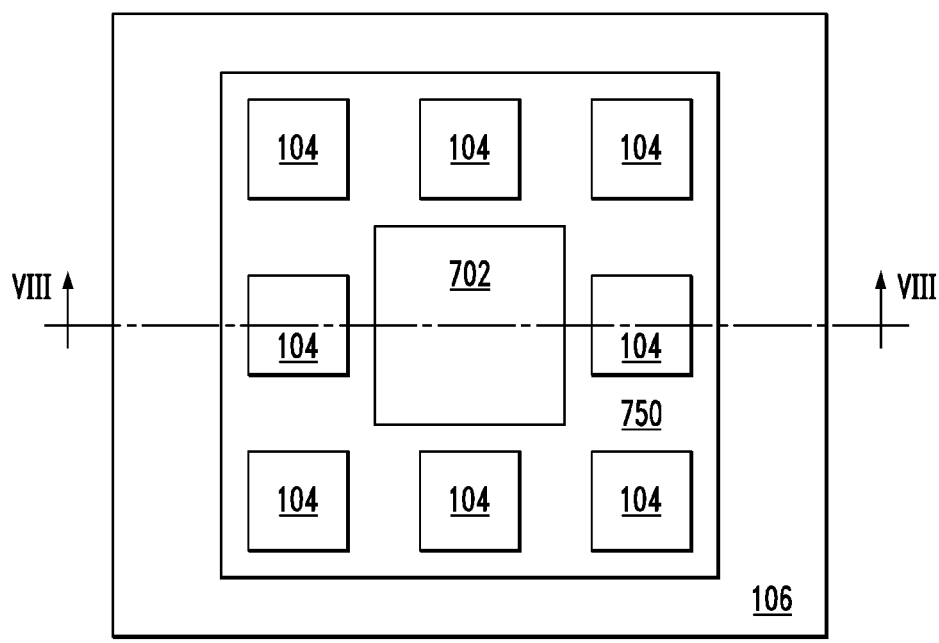
FIG. 7 is a top view of a rectangular ring cavity package, according to a further aspect of the invention (please note that the terms top view and plan view are used interchangeably herein)
Figure 8:
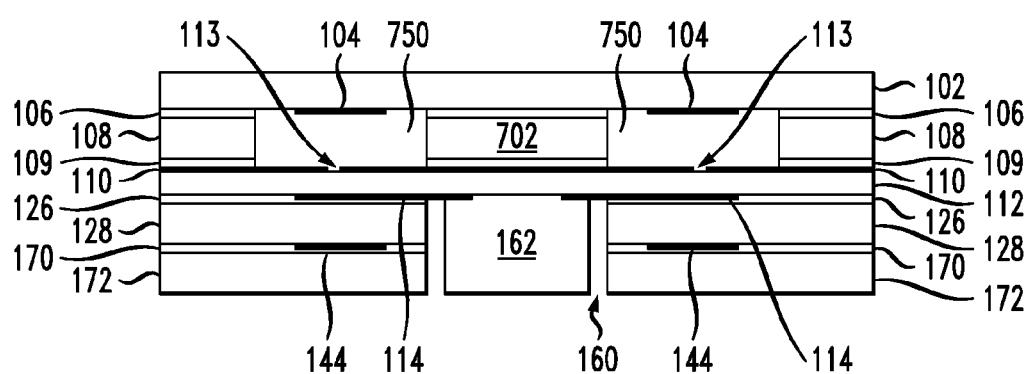
FIG. 8 is a cross section taken along line VIII-VIII in FIG. 7.
Figure 9:
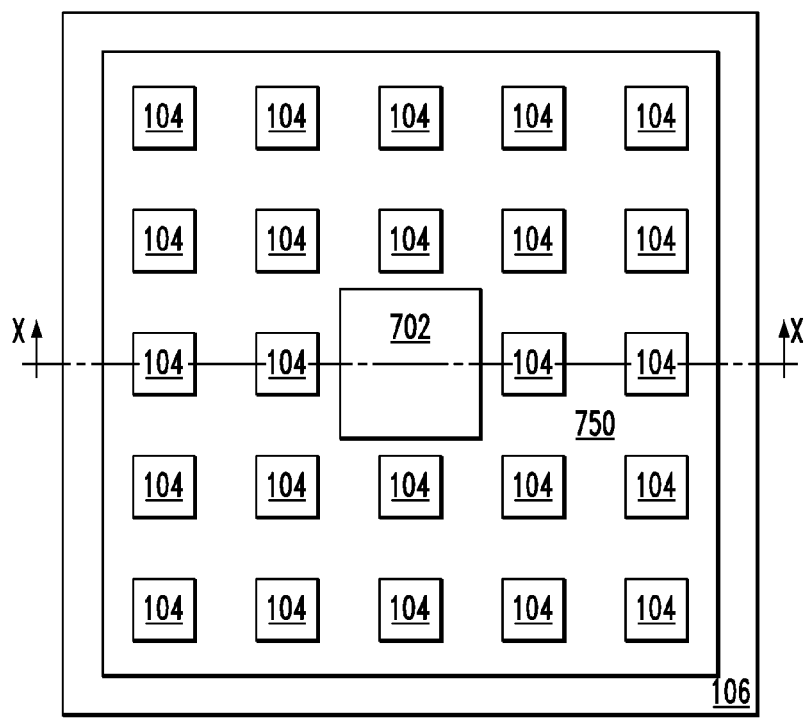
FIG. 9 is a larger version of the package of FIG. 7.
Figure 10:
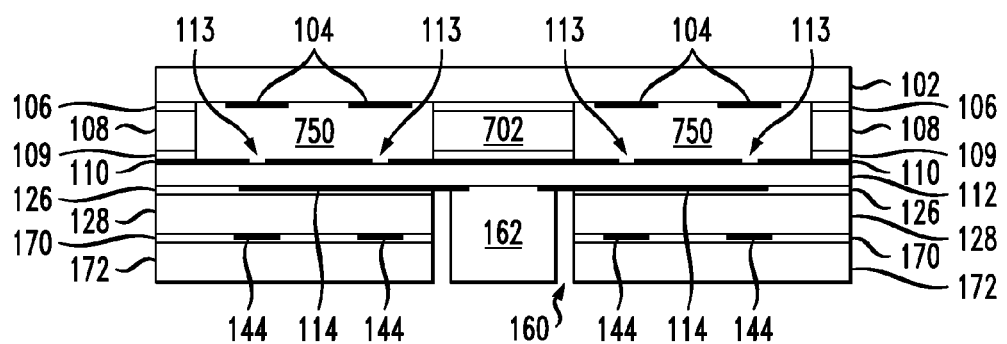
FIG. 10 is a cross section taken along line X-X in FIG. 9.
Figure 11:
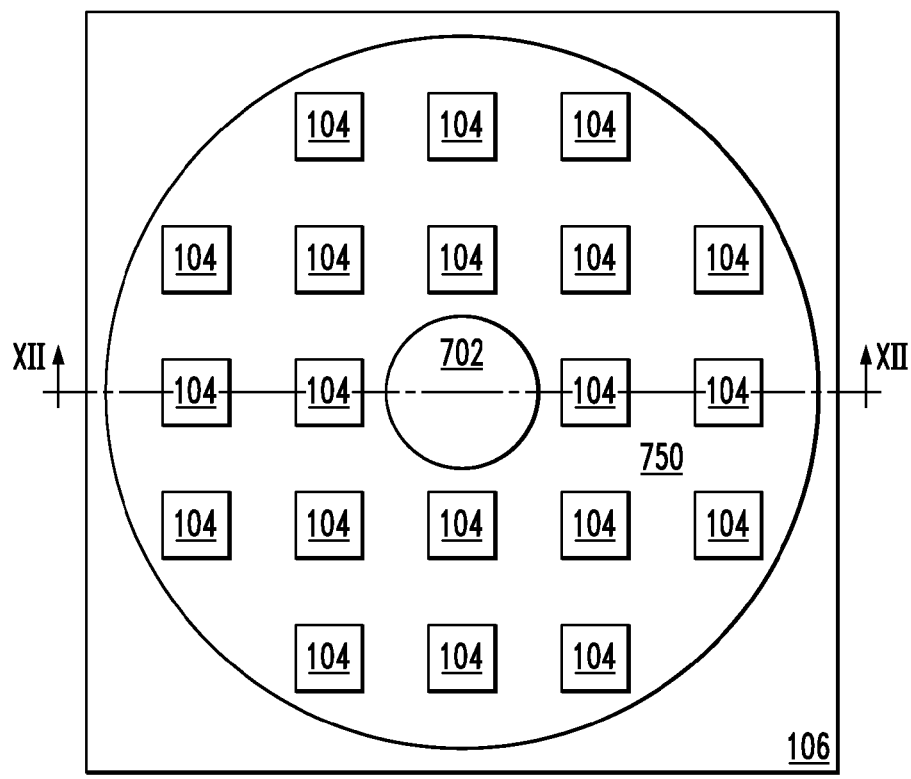
FIG. 11 is a top view of a circular ring cavity package, according to yet a further aspect of the invention.

FIGS. 7 and 8 show, respectively, the top and cross-sectional views of an exemplary package embodiment with integrated antennas. Elements similar to those described in the previous figures have received the same reference character. As seen in FIG. 8, the package has the same "stackup" as the existing package in FIG. 3 (pads and vias omitted for clarity). However, there is a rectangular ring cavity 750 for all antennas, to help the antenna to have wide bandwidth and high efficiency. There is also a center island 702 to support the package cover 102 so the cover will not sag. The island 702 is also desirable so that the package will not deform during the attachment of chip 162. With this configuration, more than one antenna ring is possible (as seen in FIGS. 9 and 11) and the antenna feed lines 114 can be very short. Island 702 can include layers 106, 108, 109, and can be formed, for example, by milling cavity 750 into those layers. To make an island, one typically needs to mill two times. Initially, adhere a first side "A" (say the top side) of layer 108 to a separate material C, mill half way on second side "B" (say, the bottom side) of layer 108. Remove the material C from layer 108. Then, glue the layer 108 to layer 112 with layer 109, and mill the rest of the material off from side A. FIGS. 9 and 10 are similar to FIGS. 7 and 8, but with a larger cavity 750 holding more antennas.

Figure 12:
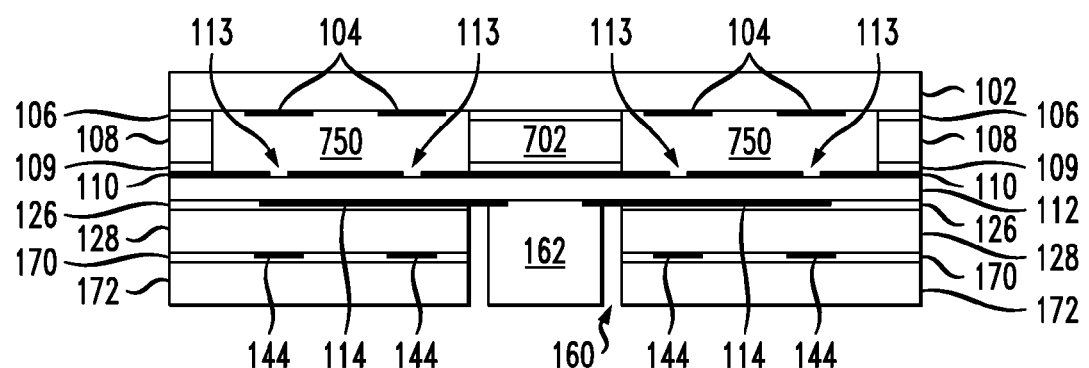
FIG. 12 is a cross section taken along line XII-XII in FIG. 11.
Figure 13:
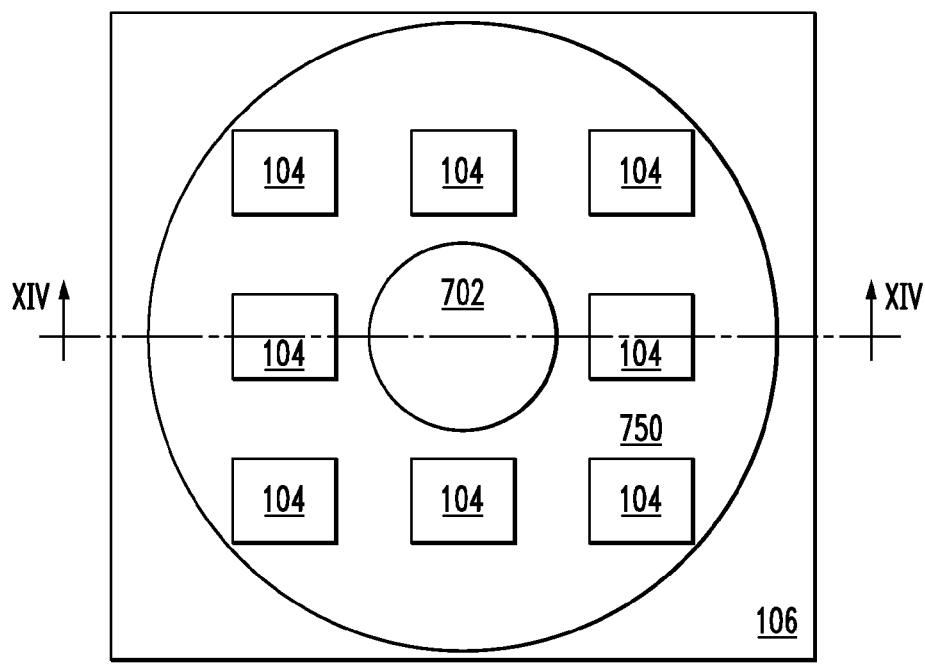
FIG. 13 is a smaller version of the package of FIG. 11.
Figure 14:
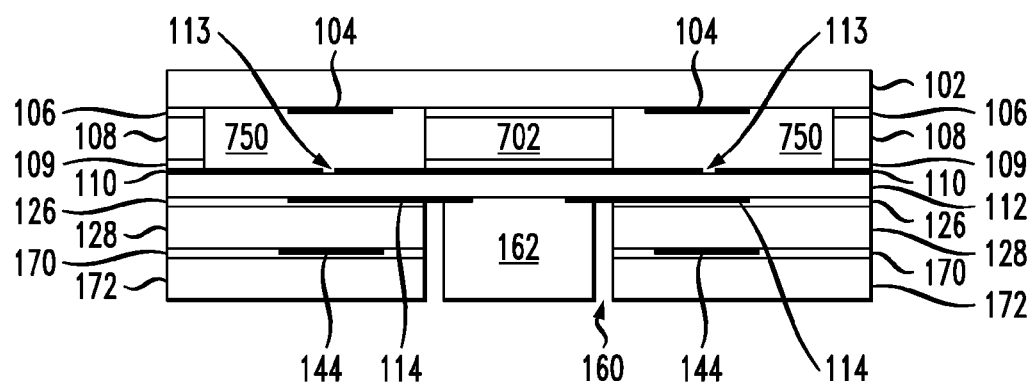
FIG. 14 is a cross section taken along line XIV-XIV in FIG. 13.

FIGS. 11 and 12 show, respectively, the top and cross-sectional views of another exemplary package embodiment with integrated antennas. Here, a circular ring cavity 750 is employed. Circular ring cavity 750 may, in at least some instances, be easier to manufacture (since circular shapes tend to be easier to mill) than the rectangular ring cavity shown in FIGS. 7-10. Island 702 is also circular in this embodiment. FIGS. 13 and 14 are similar to FIGS. 11 and 12, but with a smaller cavity 750 holding fewer antennas. Simulations indicate that in at least some instances, circular arrays have slightly better radiation patterns than rectangular arrays.

Figure 15:
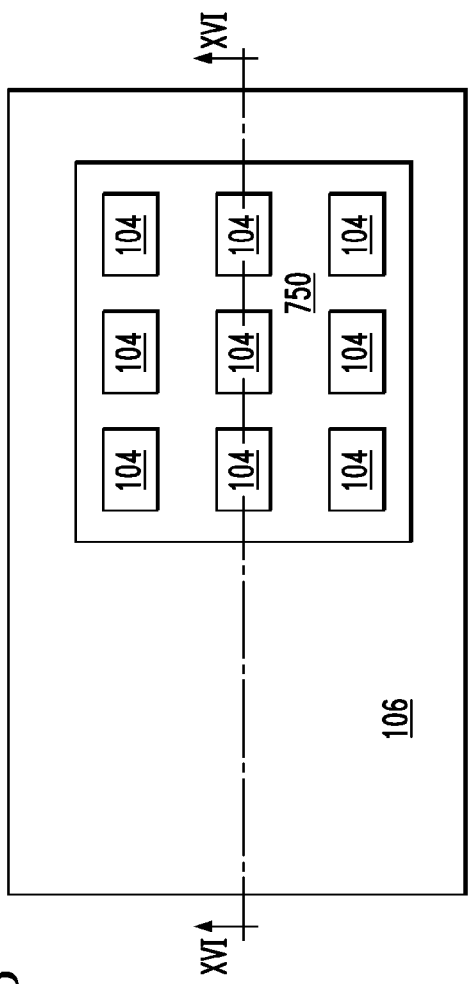
FIG. 15 is a top view of an offset (side-by-side) cavity package, according to a still further aspect of the invention.
Figure 16:
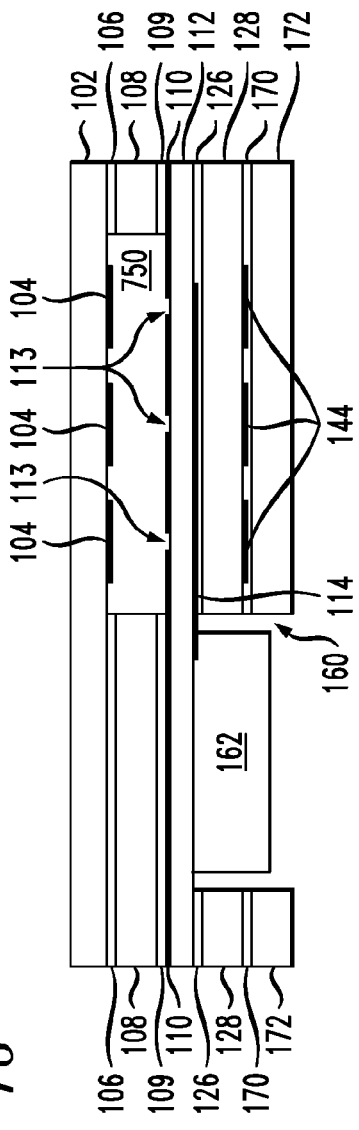
FIG. 16 is a cross section taken along line XVI-XVI in FIG. 15.

For smaller arrays, an offset or side-by-side configuration is possible, as shown in FIGS. 15 and 16. The RF chip 162 is typically much smaller than the antenna arrays. Thus, this configuration will not increase the package size much. However, the feed lines 114 will be longer than the configurations shown in FIGS. 7-14, and thus, the approach of FIGS. 15 and 16 is advantageous for small array applications. Offsetting chip 162 in cavity 160 from antenna cavity 750 prevents undesirable deflection and stress when chip 162 is mounted in cavity 160, as the layers 102, 106, 108, 109, 110, 112 above cavity 160 provide support, and thus, no island is needed in cavity 750. The antenna radiation patterns are also slightly better in the offset case than the patterns for the ring cavity case, since the array is completely filed. However, in at least some instances, the array feed lines are more challenging to design in the offset case, especially for larger arrays.

Figure 17:
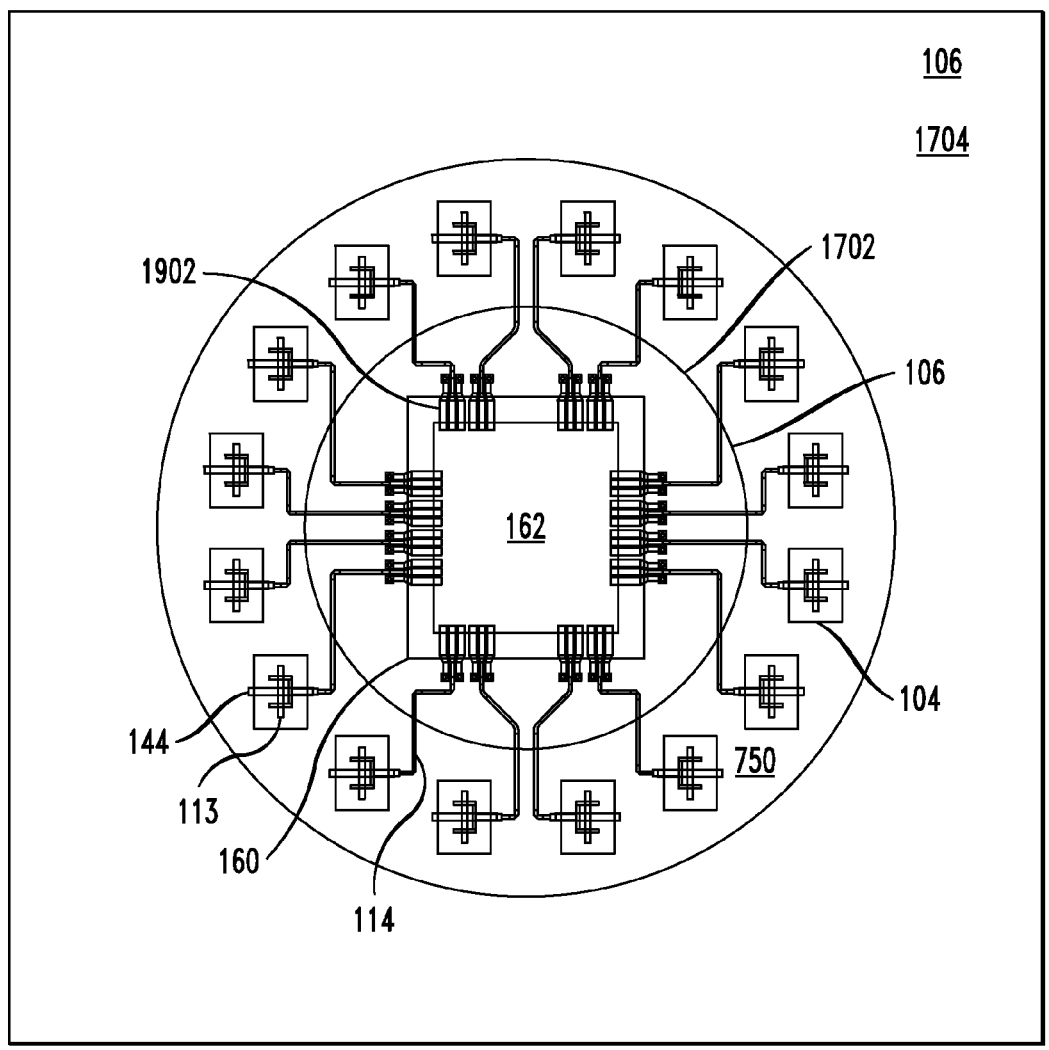
FIG. 17 is a top view of an exemplary sixteen antenna phased-array configuration, according to an even further aspect of the invention.
Figure 18:
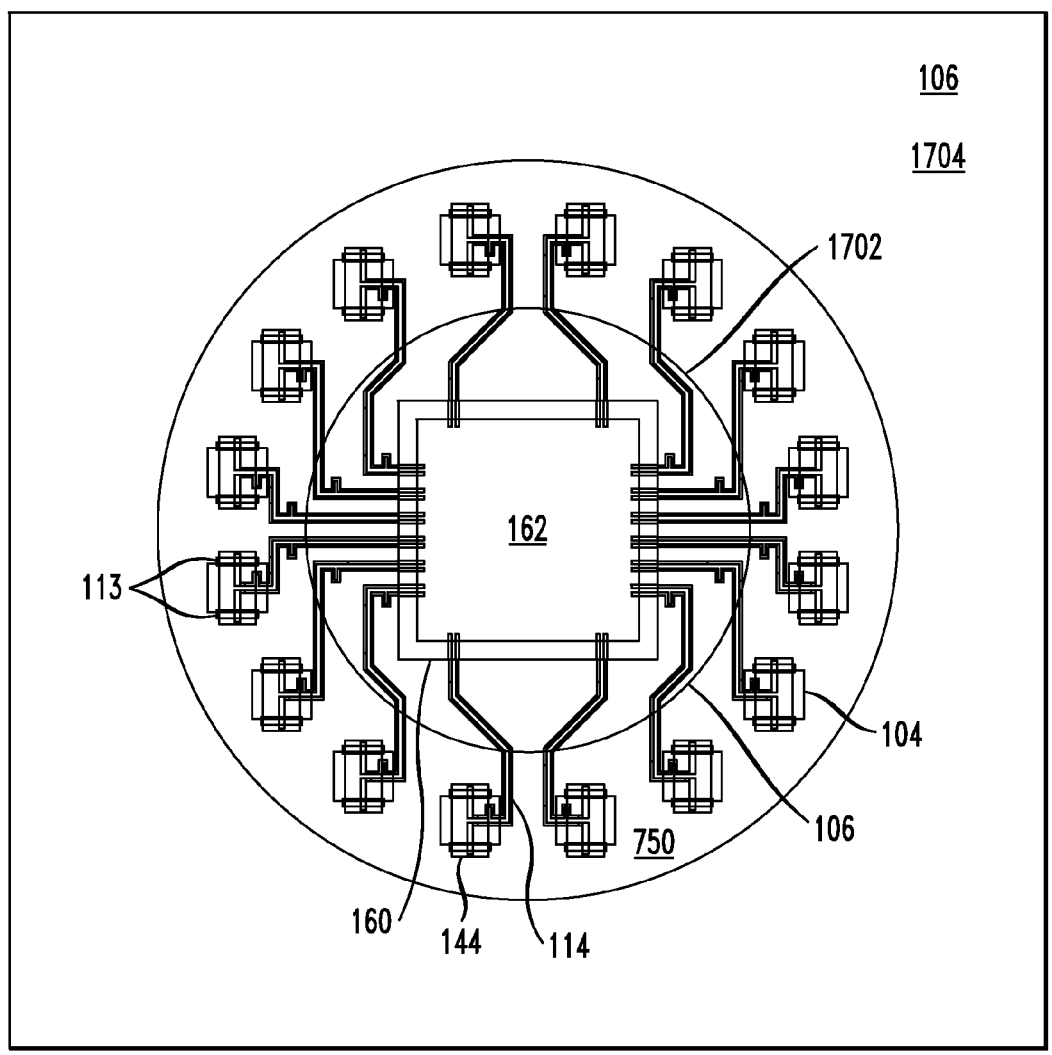
FIG. 18 is a top view of another exemplary sixteen antenna phased-array configuration, according to an additional aspect of the invention.

FIGS. 17-18 show first (receiver) and second (transmitter) sixteen antenna element phased configurations. In FIGS. 17 and 18, as in the other illustrative island embodiments, cavity 750 is defined in layers 106, 108, 109, having island 1702 and outer portion 1704. For the configurations in FIGS. 17 and 18, the package size is only 28 mm×28 mm, with a 46 mil height (into the page) (Note 46 mil=0.046 inches=1.17 mm). In FIG. 17, the RF chip 162 requires coplanar waveguide (CPW) feed antennas so there are sixteen microstrip to CPW transitions 1902. Chip 162 resides in chip cavity 160. (Note also feed lines 114, reflectors 144, and ground plane slots 113.) The configuration of FIG. 17 employs one ground plane slot per patch, while that in FIG. 18 employs two ground plane slots 113 per patch 104. Note also FIGS. 17 and 18 are top views where dashed (hidden) lines are not used, for illustrative convenience—chip 162 in cavity 160 is located below island 1702, just as in FIGS. 7-14.

One or more embodiments of the invention thus provide a package with a socket 160 for an RF chip 162, and an internal cavity 750 for planar antenna arrays. The antenna cavity 750 can be, for example, a circular or rectangular ring, or a large cavity for side-by-side configurations (an example of the latter is shown in FIGS. 15 and 16). Embodiments of the package can implement a planar phased array, preferably without the need for vias for RF feed, and in one or more embodiments, with a substantially equal, and relatively short, feed line length. If a relative larger phased array is required, more antenna elements can be used by enlarging the cavity size, as shown in FIGS. 9-12.

In view of the description of FIGS. 7-18, it will be appreciated that, in general terms, a radio-frequency integrated circuit chip package with N integrated aperture-coupled patch antennas, N being at least two, includes N generally planar patches 104, as well as at least one generally planar ground plane 110 spaced inwardly from the N generally planar patches and substantially parallel thereto. The ground plane is formed with N coupling aperture slots 113 therein, and the slots are substantially opposed to the patches 104 (in some instances, such as FIG. 18, there may be more than N slots—for example, 2N slots, two slots for each patch). N feed lines 114 are spaced inwardly from the ground plane 110 and substantially parallel thereto. At least one radio frequency chip 162 is spaced inwardly from the feed lines 114 and coupled to the feed lines 114 and the ground plane 110. Note that vias, pads, and anti-pads as described with respect to FIGS. 1-6 can also be used in the embodiments of FIGS. 7-18. The N patches 104 can be arranged to form a planar phased array.

A first substrate layer, such as that formed by bound film 126 and substrate 128, is spaced inwardly from the feed lines 114, and is formed with a chip-receiving cavity 160, with the chip 162 being located in the chip-receiving cavity. A second substrate layer, such as that formed by films 106, 109 and substrate 108, is interposed in a region between the ground plane 110 and a plane defined by the patches 104. The patches 104 are formed in a first metal layer, the ground plane 110 is formed in a second metal layer, and the second substrate layer defines an antenna cavity 750, with the N generally planar patches 104 being located in the antenna cavity 750.

In some instances, an island 702, 1702 is formed in the second substrate layer, within the cavity 750, thus defining a ring shape of the cavity, and the N generally planar patches 104 are located in the ring shape, with the island 702, 1702 being substantially opposed to the chip-receiving cavity 160. "Substantially opposed," as used herein, is intended to describe a configuration where the island at least partially overlaps the chip-receiving cavity when viewed in plan, to help support insertion loads from insertion of chip 162 into cavity 160. The island and the cavity may have a variety of shapes, and may have the same or different shapes in any particular instance. In some exemplary, non-limiting cases, both are substantially rectangular (rectangular encompassing, but not limited to, square) when viewed in plan, while in other, exemplary, non-limiting cases, both are substantially circular when viewed in plan.

In some instances, a third substrate layer, such as that formed by substrate 112, is interposed in a region between the ground plane 110 and the feed lines 114, and the feed lines 114 are formed in a third metal layer. In one or more embodiments, N reflectors 144 are spaced inwardly from the third substrate layer and generally opposed to the coupling aperture slots 113. The reflectors 144 can be located, for example, on an inner surface of the first substrate layer. Furthermore, in some instances, a fourth substrate layer, such as that formed by bound film 170 and substrate 172, is spaced inwardly from the reflectors 144, with the reflectors 144 being embedded between the first and fourth substrate layers.

In other instances, such as shown in FIGS. 15 and 16, the antenna cavity 750 is spaced away from the chip-receiving cavity 160 when viewed in plan, such that loads incurred during insertion of the chip 162 into the chip-receiving cavity 160 are substantially supported away from the antenna cavity (for example, by compression in the layers 102, 108, 106, 109, 110, 112 immediately over chip 162).

In some instances, a cover, such as layer 102, is secured over the antenna cavity 750, and is at least partially supported by the island 702.

In another aspect, a method of fabricating a radio-frequency integrated circuit chip package of the kind described includes providing a package of the kind described, without the chip 162 inserted, and with the island 702 as described, as well as inserting at least one radio frequency chip 162 into the cavity 160, with the island 702 supporting loads induced by the insertion of the chip into the cavity.

In yet another aspect, a method of fabricating a radio-frequency integrated circuit chip package of the kind described includes providing a package of the kind described, without the chip 162 inserted, and with the antenna cavity spaced away from the chip-receiving cavity when viewed in plan (as shown, for example, in FIGS. 15 and 16), as well as inserting at least one radio frequency chip 162 into the cavity 160, such that loads incurred during insertion of the chip 162 into the chip-receiving cavity 160 are substantially supported away from the antenna cavity (for example, by compression in the layers 102, 108, 106, 109, 110, 112 immediately over chip 162).

Internal cavities can be produced in PCB-based packages, as described above, but may involve some challenging processes. Internal cavities are very difficult to implement in the low temperature co-fired ceramic (LTCC) process. To address these issues, additional aspects of the invention will now be described. Thus the package design can be implemented in both PCB and LTCC processes. In one or more embodiments, the package can be split into two parts: a main part and a cover.

Aspects of the invention provide an apparatus and method for low cost packages with integrated antennas and phased arrays, operating in the millimeter wave (mmWave) range. One or more embodiments of a package with integrated antennas are based on multilayer PCB or LTCC, and include a rectangular or ring cavity for implementing high performance antenna arrays and another cavity for housing mmWave RF chips. In one or more embodiments, the internal cavity is avoided by splitting the package into two parts: a main body and a cover. This approach is consistent with the PCB and LTCC manufacturing processes and can be used for packages with an integrated antenna or antenna array. Further, this approach is suitable for automatic processes and reduces the number of components involved with packaging antennas. The "splitting" approach relates generally to low cost packaging with integrated antennas or planar phased arrays, and to chip packaging with integrated antennas or planar phased array designs for mmWave frequencies and above.

Figure 19:
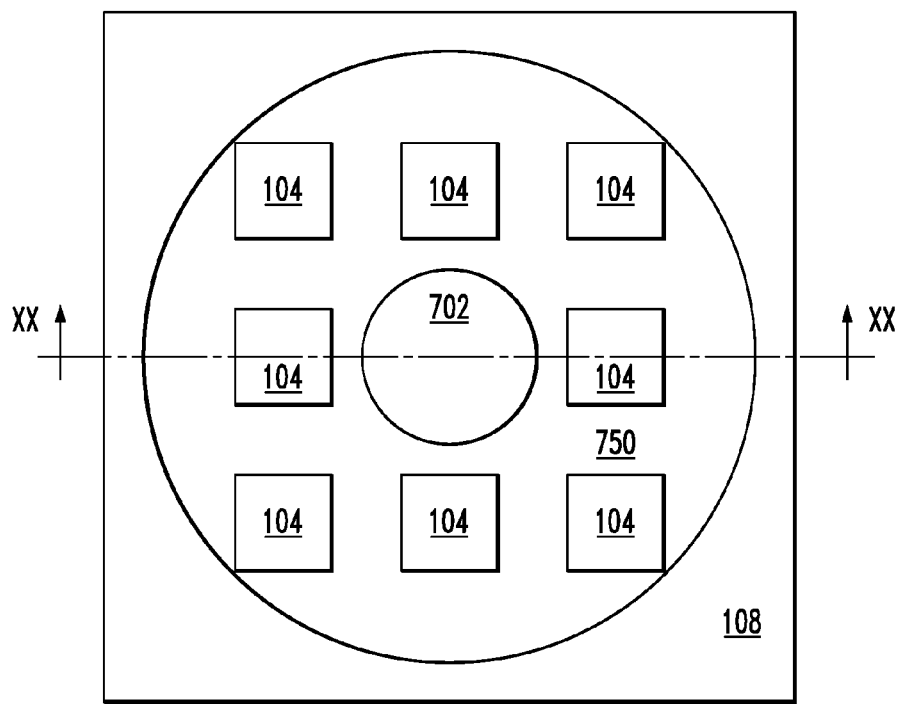
FIG. 19 is a top view of a two-part package with a cover, according to an additional aspect of the invention.
Figure 20:
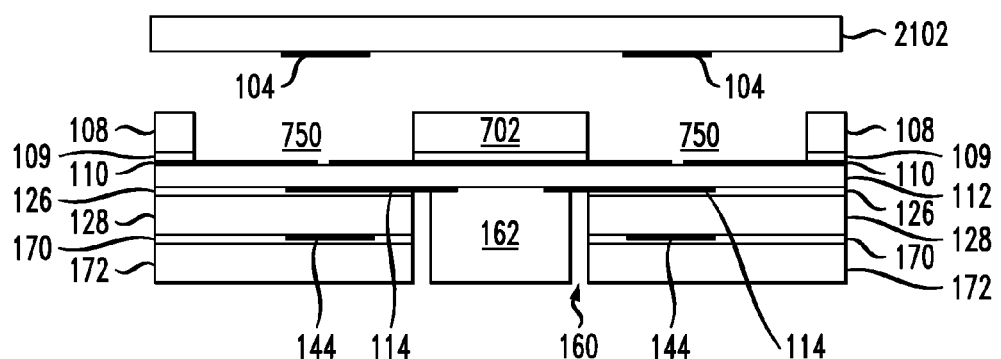
FIG. 20 is a cross section taken along line XX-XX in FIG. 19.
Figure 21:
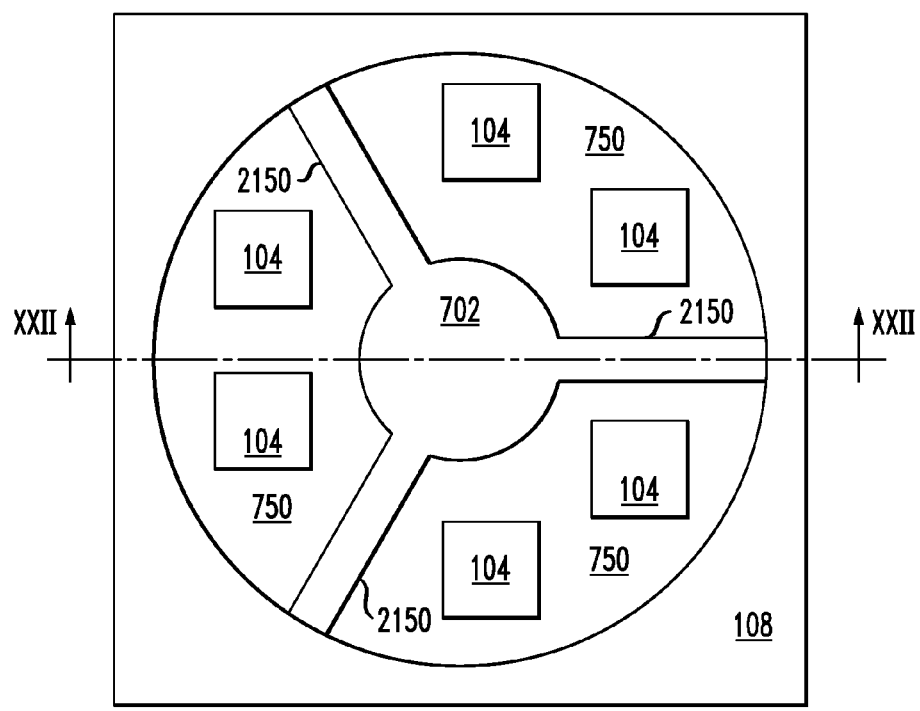
FIG. 21 is a top view of a two-part package similar to that of FIG. 19, but with support ridges.
Figure 22:
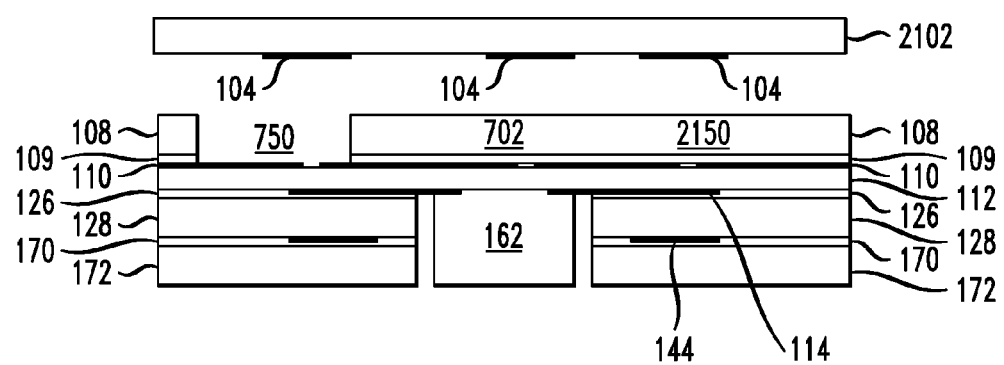
FIG. 22 is a cross section taken along line XXII-XXII in FIG. 21.

Thus, in the "flipping" approach, the embedded (internal) cavity becomes an open cavity. FIGS. 19 and 20 show top and sectional views of a first "splitting" embodiment. This embodiment is similar to that of FIGS. 13 and 14, except that layers 106 and 102 are omitted, and cover 2102 is present. The embodiment of FIGS. 21 and 22 is similar to that of FIGS. 19 and 20, except that ridges 2150 are provided to support island 702. For the structures in FIGS. 19-22, the opened cavity 750 is positioned in the "main" (lower) part, as opposed to the cover 2102, since the chip 162 preferably should have back support.

Figure 23:
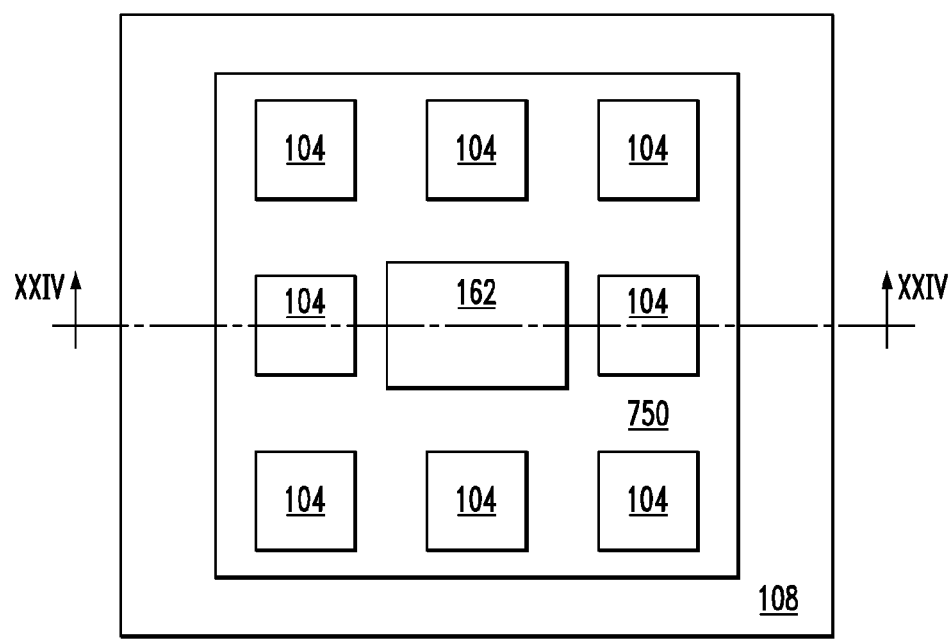
FIG. 23 is a top view of a two-part package with an embedded chip, according to yet another additional aspect of the invention.
Figure 24:
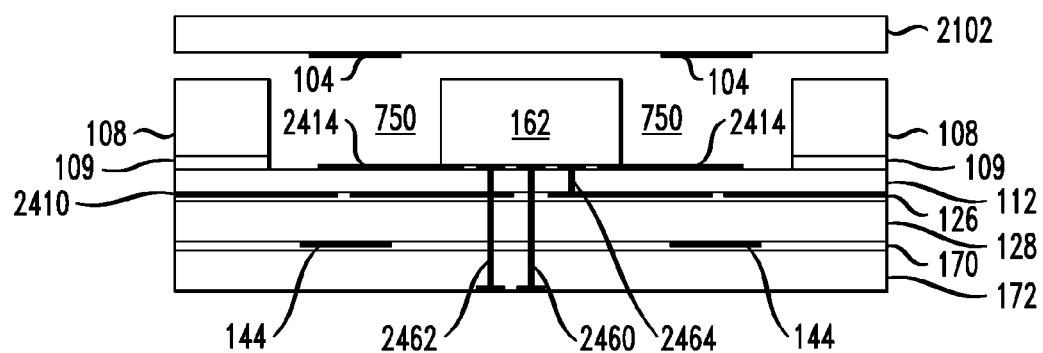
FIG. 24 is a cross section taken along line XXIV-XXIV in FIG. 23.
Figure 25:
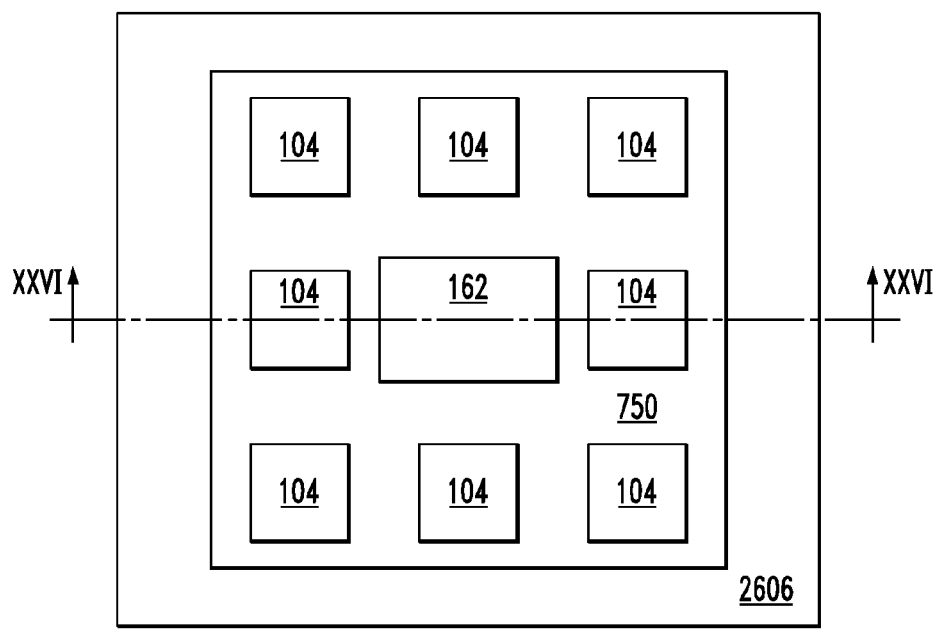
FIG. 25 is a top view of a different version of a two-part package with an embedded chip.
Figure 26:
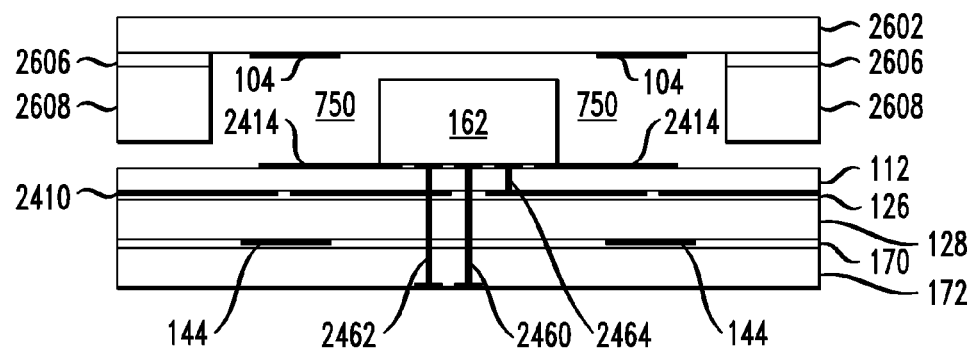
FIG. 26 is a cross section taken along line XXVI-XXVI in FIG. 25.

The embodiment of FIGS. 23 and 24 is somewhat similar to that of FIGS. 7 and 8, except that the "splitting" approach is employed, such that cover 2102 is employed and layer 106 is omitted, and the chip 162 is located within cavity 750 instead of region 160 as in FIG. 8. Attendant changes are made in the feed line 2414, which is located on an upper surface of layer 112, and in the ground plane 2410 (with slots, not separately numbered), which is located between layers 112, 126. Ground vias 2462, 2464 are provided to make an external ground terminal available (via 2462) and to ground chip 162 to ground plane 2410. One or more additional vias 2460 can be provided for signals, power, and/or control purposes. The embodiment of FIGS. 25 and 26 is similar to that of FIGS. 23 and 24, except that in this case cavity 750 is essentially formed in the cover portion, as layers 2606, 2608 are provided on cover portion 2602. For the structures in FIGS. 23-26, the open cavity 750 can either go to the main part, as in FIGS. 23 and 24, or the cover part, as in FIGS. 25 and 26 (since chip 162 is present in cavity 750). In any of the "split" embodiments, the two parts (cover portion and main portion) can be fastened, for example, by gluing together or flip-chipping together, as known to the skilled artisan from B. Min and G. M. Rebeiz, "A Low-Loss Silicon-on-Silicon DC-110-GHz Resonance-Free Package," IEEE Trans. on Microwave Theory and Techniques, Vol. 54, No. 2, pp. 710-716, February 2006.

Additional manufacturing steps are needed to make the island 702. To reduce the steps, ridges 2150 can be used as shown in FIGS. 21-22. By way of clarification, the island is an isolated part. If one mills layer 108, it will fall off or move. That is why it is hard to make. If ridges are used the "island" is attached to the other part of layer 108. So milling is much easier.

The antennas in FIGS. 19-22 function similarly to those described above. The embodiments in FIGS. 23-26 have certain significant differences. The chip 162 is completely inside the package, so it is fully protected. A different aperture-coupled patch antenna is employed; as alluded to in the description of FIG. 24, the feed lines 2414 are between the patch 104 and the ground plane 2410. This is possible since reflectors 144 are used. Further, the embodiments of FIGS. 23-26 are particularly advantageous for mass production, since different via structures are used, as described with regard to FIG. 24.

Figure 27:
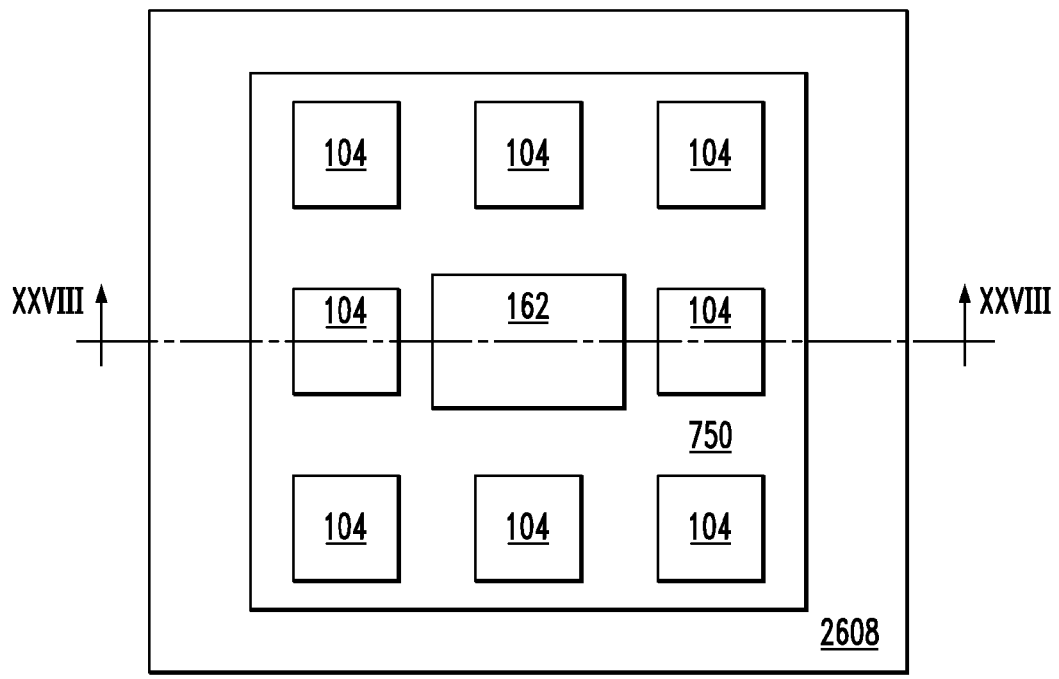
FIG. 27 is a top view of an LTCC-based two-part package, according to still another additional aspect of the invention.
Figure 28:
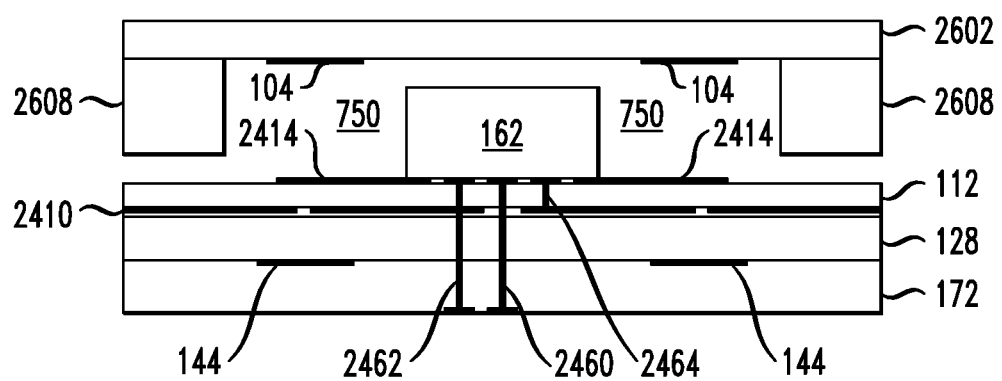
FIG. 28 is a cross section taken along line XXVIII-XXVIII in FIG. 27.

Adhesive layers, such as layers 170, 126, 2606, in FIG. 26, may typically be employed for embodiments using PCB manufacturing techniques. In another approach, shown in FIGS. 27 and 28, LTCC manufacturing techniques are employed, and the adhesive layers are not needed.

Figure 29:
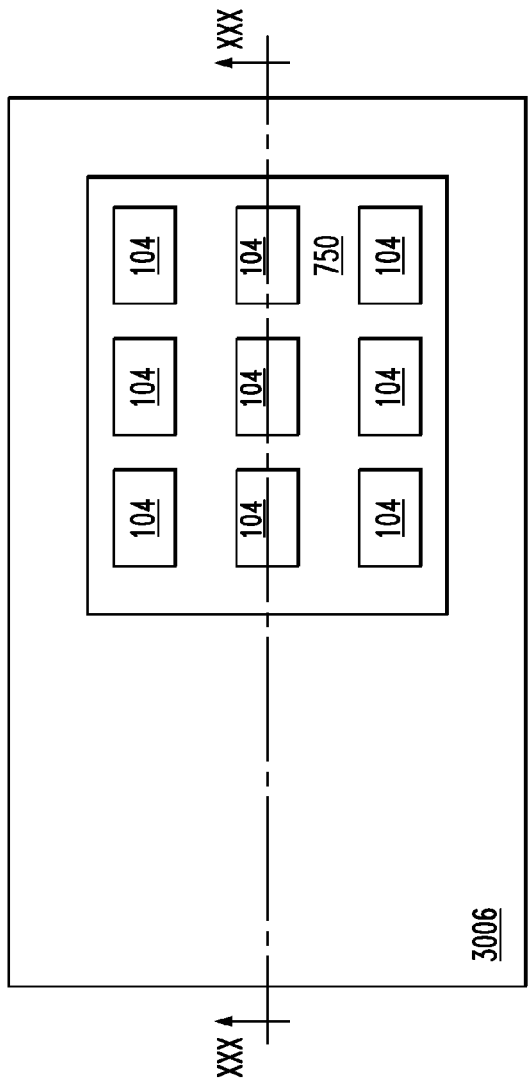
FIG. 29 is a top view of an exemplary two-part side-by-side package, according to an even further additional aspect of the invention.
Figure 30:
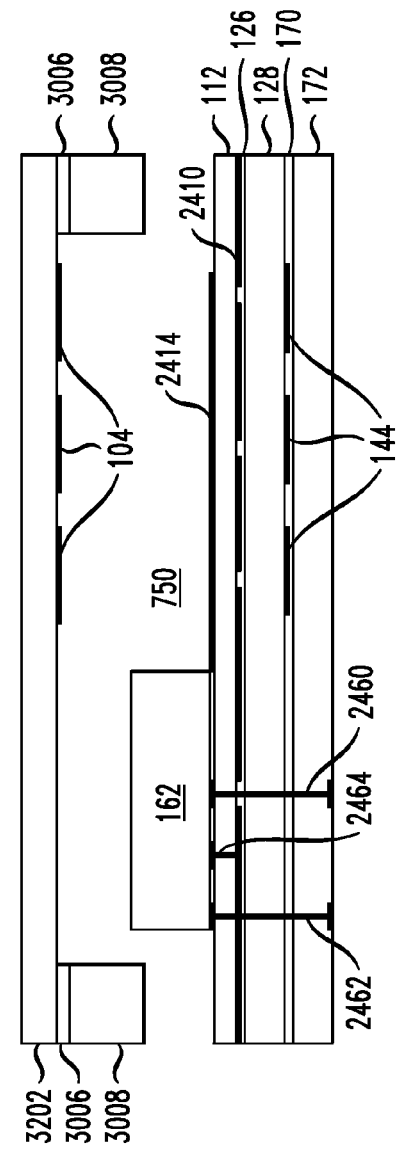
FIG. 30 is a cross section taken along line XXX-XXX in FIG. 29.
Figure 31:
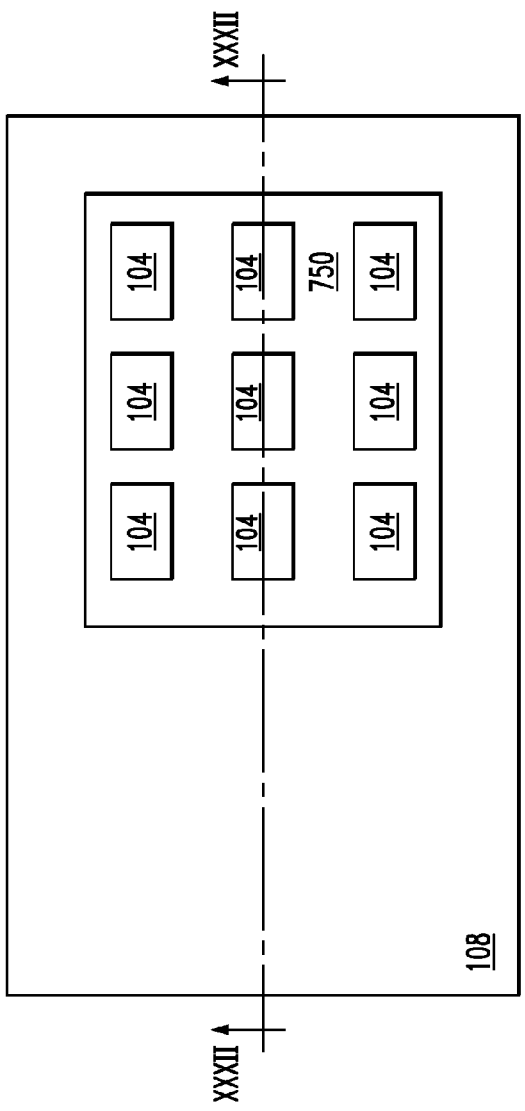
FIG. 31 is a top view of a different version of a two-part side-by-side package.
Figure 32:
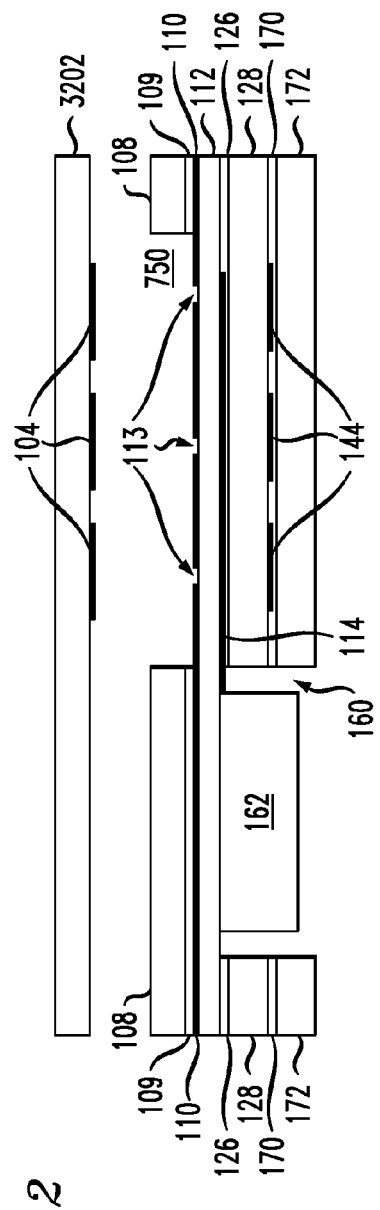
FIG. 32 is a cross section taken along line XXXII-XXXII in FIG. 31.

FIGS. 31 and 32 show top and sectional views of a side-by-side "splitting" embodiment. This embodiment is similar to that of FIGS. 15 and 16, except that layers 106 and 102 are omitted, and cover 3202 is present. The embodiment of FIGS. 29 and 30 are similar to FIGS. 31 and 32, except that in this case cavity 750 is essentially formed in the cover portion, as layers 3006, 3008 are provided on cover portion 3202; furthermore, chip 162 is in cavity 750, vias 2460, 2462, and 2464 are provided as described with respect to FIG. 24, and the feed line 2414 is located between patches 104 and ground plane 2410, with use of reflectors 144, as described above with respect to FIG. 24.

Figure 33:
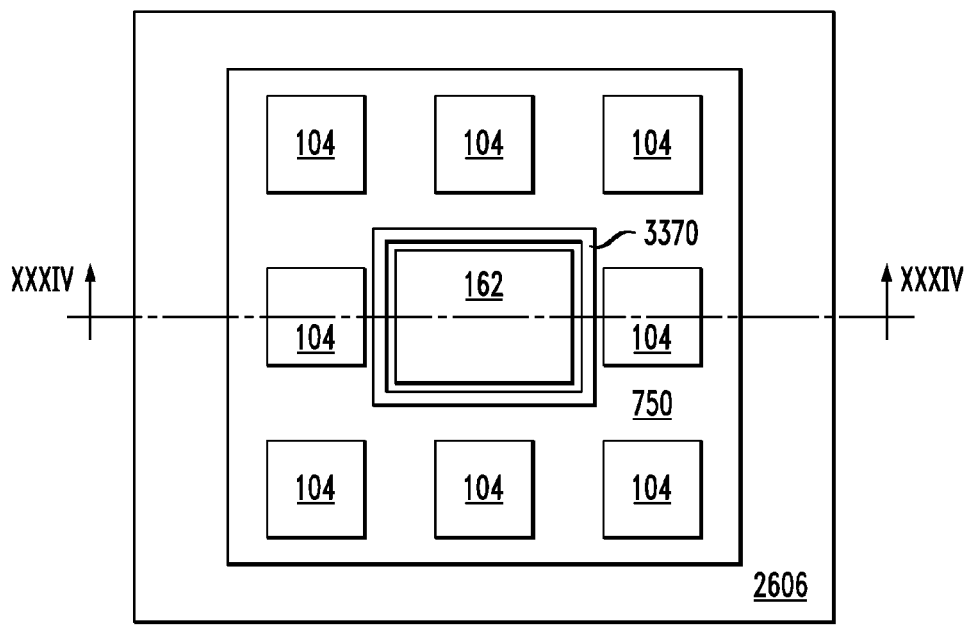
FIG. 33 is a top view of a package similar to FIG. 23, but with a support ring.
Figure 34:
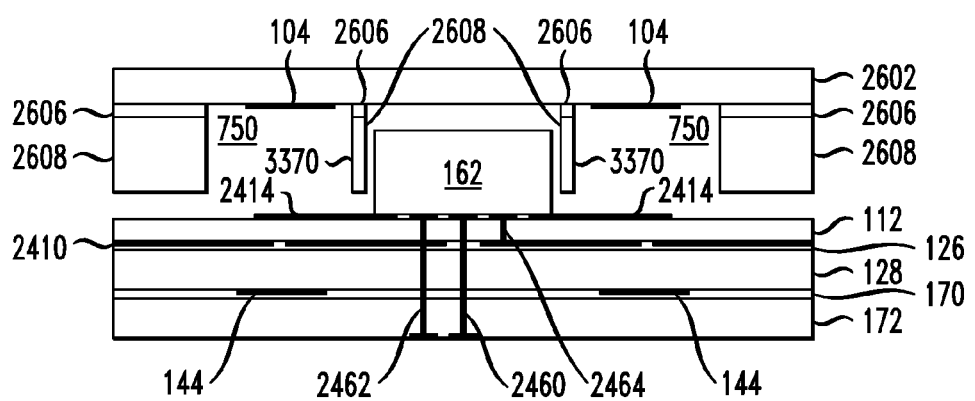
FIG. 34 is a cross section taken along line XXXIV-XXXIV in FIG. 33.

In embodiments such as those of FIGS. 23-28, the RF chip 162 can provide some support to the package cover. However, this puts some limits on the antenna cavity design, and the chip support for the cover might not be sufficient if a larger array is required. In this case, a ring support 3370 to the cover might be advantageous, as shown in FIGS. 33-34, which are otherwise similar to FIGS. 25 and 26. Ring support 3370 can be formed, for example, in layers 2606, 2608. Ridges similar to ridges 2150 can optionally be employed with ring support 3370 (not shown in FIGS. 33 and 34), to make manufacturing more easy, as described above.

Figure 35:
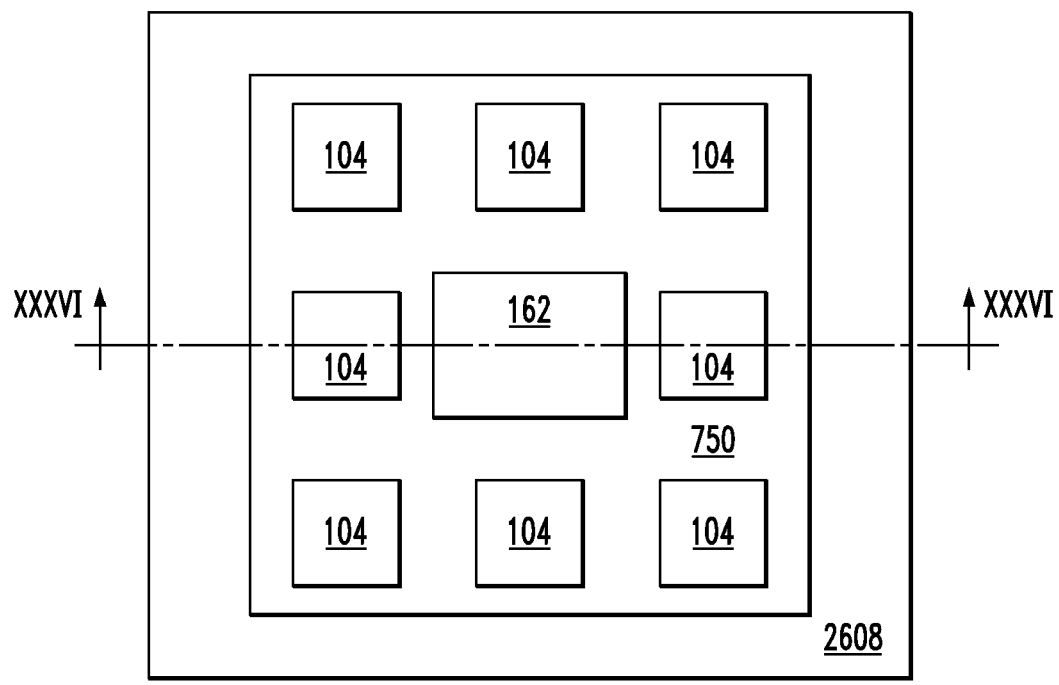
FIG. 35 is a top view of an exemplary wire-bond package, according to a still further additional aspect of the invention.
Figure 36:
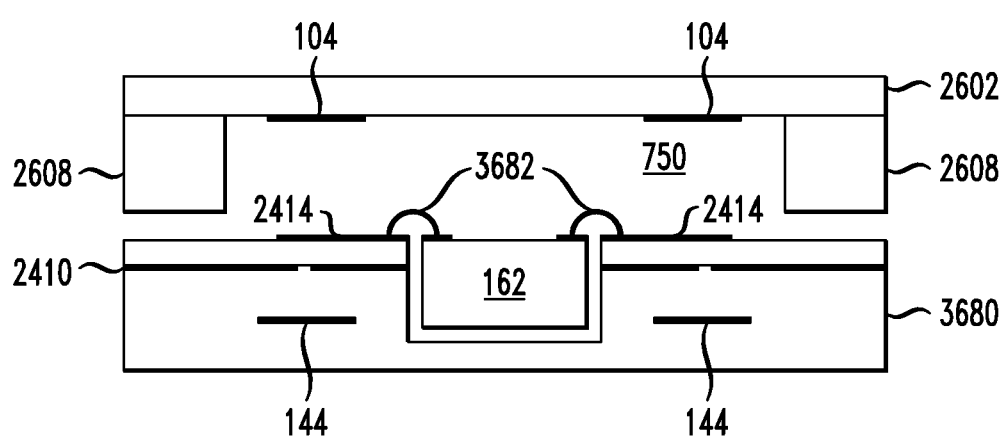
FIG. 36 is a cross section taken along line XXXVI-XXXVI in FIG. 35.
Figure 37:
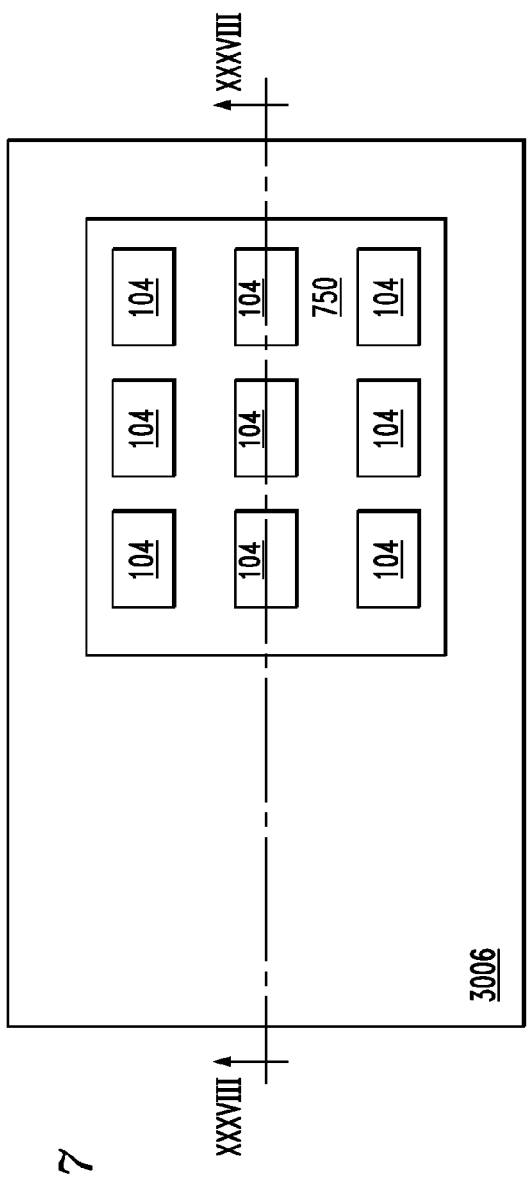
FIG. 37 is a top view of an exemplary side-by-side wire-bond package, according to a still another additional aspect of the invention.
Figure 38:
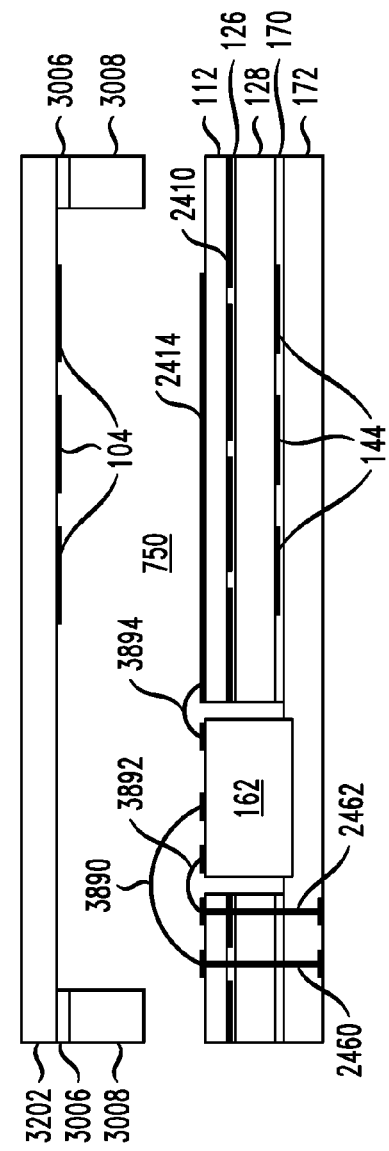
FIG. 38 is a cross section taken along line XXXVIII-XXXVIII in FIG. 37.

In a number of exemplary embodiments described above, the chip 162 is flip-chip attached to the package. The flip-chip attachment provides good interconnection performance. However, flip-chip process may, at least in some circumstances, cost more than the wirebonding process. FIGS. 35 and 36 show an embodiment with wire bonds 3682 to interconnect chip 162 with feed lines 2414. Chip 162 is present in a cavity (not separately numbered) in a lower portion 3680, which may have, for example, two layers due to the reflector 144. Vias are omitted from FIG. 36 for clarity. FIGS. 37 and 38 show a wire-bonded side-by-side embodiment, with wire bonds 3890 to interconnect chip 162 to via 2460; wire bond 3892 to interconnect chip 162 with via 2462; and wire bond 3894 to interconnect chip 162 with feed line 2414.

One or more embodiments thus provide ridged structures, such as 2150, that can be used to remove the center island (that is, the structure is no longer an island since it is connected to other parts). Furthermore, in some embodiments, such as in FIGS. 24, 26, 28, 30, 34, 36, and 38, the feed line can be between the patch and the ground plane. Yet further, some embodiments provide a two-part structure that allows the chip to be wirebonded to the package, as in FIGS. 36 and 38, and/or a two-part structure with the chip embedded inside the package, as in FIGS. 24, 26, 28, 30, 34, 36, 38.

Thus, one or more embodiments of a radio-frequency integrated circuit chip package with N integrated aperture-coupled patch antennas, N being at least one, include a cover portion 2102, 2602, 3202, with N generally planar patches; and a main portion (lower stackup in FIGS. 20, 22, 24, 26, 28, 30, 32, 34, 36, and 38) coupled to the cover portion. The main portion includes at least one generally planar ground plane 110, 2410 spaced inwardly from the N generally planar patches 104 and substantially parallel thereto. The ground plane is formed with at least N coupling aperture slots therein, the slots being substantially opposed to the patches. The main portion also includes N feed lines 114, 2414 spaced inwardly from the N generally planar patches and substantially parallel thereto, and at least one radio frequency chip 162 coupled to the feed lines and the ground plane. The cover portion and the main portion cooperatively define an antenna cavity 750. The N generally planar patches 104 are located in the antenna cavity.

In some cases, such as FIGS. 24, 26, 28, 30, and 34, the chip is located in the antenna cavity, and the feed lines 2414 are located outwardly of the ground plane 2410. This is enabled by N reflectors 144 spaced inwardly from the ground plane and the feed lines and generally opposed to the coupling aperture slots. This approach can also be used in wire-bond embodiments of FIGS. 36 and 38, wherein chip 162 may be located in an outward-facing cavity in the main portion.

In some cases, the main portion has a first substrate layer, as discussed above, spaced inwardly from the feed lines 114, and the first substrate layer is formed with a chip-receiving cavity 160, the chip being located in the chip-receiving cavity. In this case, the feed lines 114 are located inwardly of the ground plane 110. An island 702 can be formed within the antenna cavity, thus defining a ring shape of the cavity, the island being substantially opposed to the chip-receiving cavity. The island and/or cavity can be round, rectangular, or any other desirable shape consistent with manufacturability. One or more island support ridges 2150 can be located within the cavity.

In the case where the feed lines are inward from the ground plane, optionally, N reflectors 144 can be spaced inwardly from the ground plane and the feed lines and generally opposed to the coupling aperture slots.

As in FIGS. 26, 28, 30, 34, 36, and 38, in some instances, the cover portion is formed with inward projections to define the antenna cavity. Optionally, the cover portion can be formed with an inward-projecting ring support 3370. As in FIGS. 20, 22, 24, and 32, in other instances, the main portion is formed with outward projections to define the antenna cavity.

In some embodiments of the package, N is two or more. The N patches can be arranged to form a planar phased array.

As shown in FIGS. 30, 32, and 38, in some cases, the antenna cavity is spaced away from the chip-receiving cavity when viewed in plan. For example, in the embodiment of FIG. 32, loads incurred during insertion of the chip into the chip-receiving cavity are substantially supported away from the antenna cavity.

Figure 39:
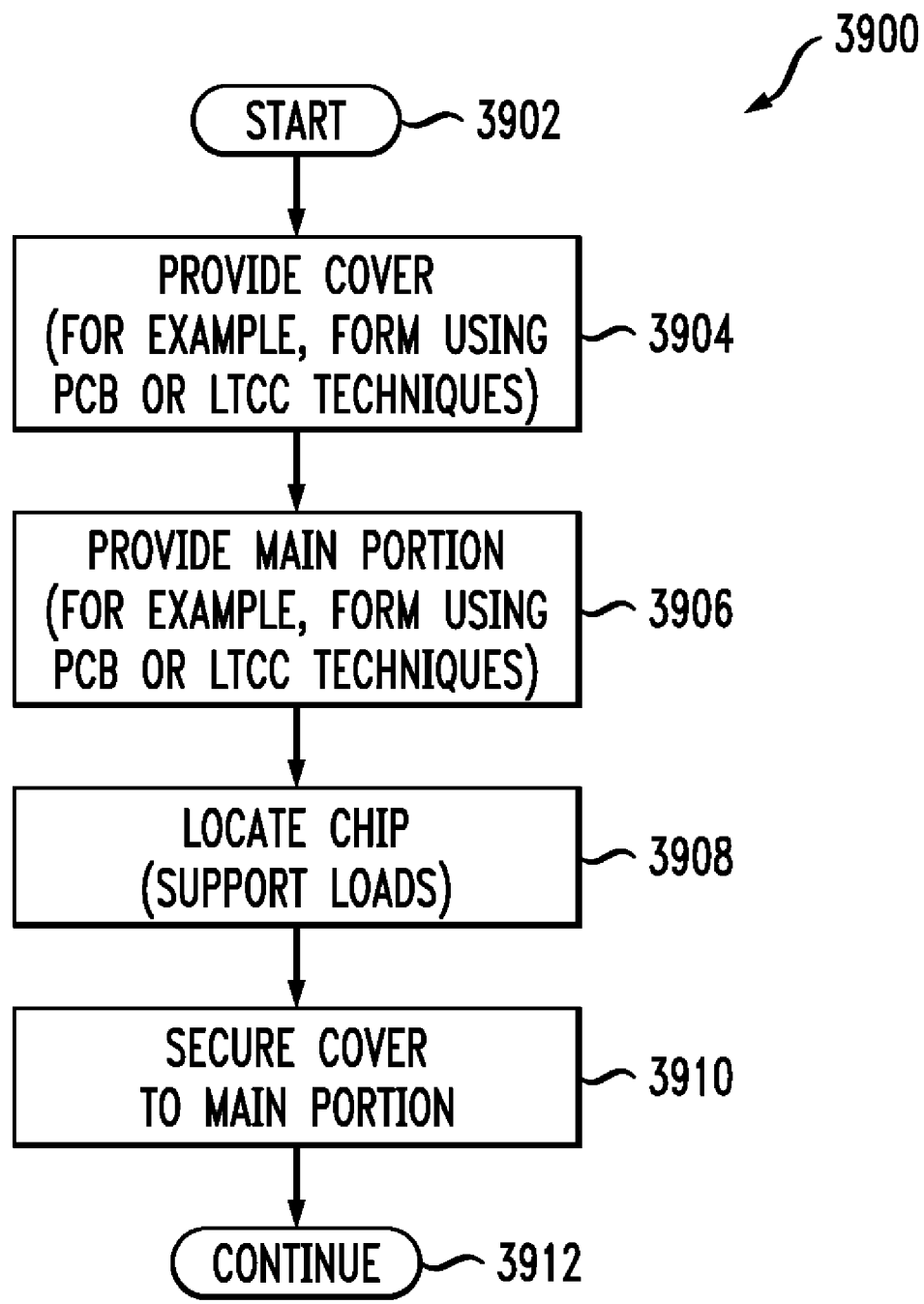
FIG. 39 is a flow chart of exemplary method steps.

In another aspect, with reference to FIG. 39, an exemplary method 3900 of fabricating a radio-frequency integrated circuit chip package with N integrated aperture-coupled patch antennas, N being at least one, is described. After beginning at step 3902, steps 3904 and 3906 include providing a cover portion and a main portion as described, and step 3910 includes securing the cover portion to the main portion. In embodiments where the chip is located in the antenna cavity, an additional step includes locating the chip in the antenna cavity, while in embodiments where the chip is located in a chip-receiving cavity, an additional step includes locating the chip in the chip-receiving cavity—both these possibilities are represented in the flow chart by step 3908. In embodiments using the island, where significant loads are anticipated during chip location, an additional step includes supporting, with the island, insertion loads associated with the location of the chip, as per the parenthetic in block 3908. Main portions and/or cover portions may be formed, for example, using printed circuit board techniques and/or co-fired ceramic techniques, as indicated by the parenthetic expressions in blocks 3904 and 3906—in other instances, these items could be obtained from elsewhere and assembled by an entity other than the entity that assembles them. The chip can be attached, for example, using flip-chip techniques or wire bond techniques. The method continues at block 3912 (for example, one could stop or fabricate more packages). Again, in some embodiments of the method, N is two or more. The N patches can be arranged to form a planar phased array.

As noted above, aspects of the invention provide an apparatus and method for low cost packages with integrated antennas and phased arrays operating in the millimeter wave (mm-Wave) range. In one or more embodiments, a package with integrated antennas is based on multilayer printed circuit board (PCB) or low temperature cofired ceramic (LTCC). The package includes a rectangular or ring cavity for implementing high performance antenna arrays and for housing mmWave RF chips. The need for an internal cavity is avoided by splitting the package into two parts: a main body and a cover. The packaging technology of such embodiments is consistent with the PCB and LTCC manufacturing processes and can be used for packages with an integrated antenna or antenna array. Thus, aspects of the invention relate generally to low cost packaging with integrated antennas or planar phased arrays, and in particular, relate to chip packaging with integrated antennas or planar phased array designs for mmWave frequencies and above. Aspects of the invention advantageously integrate antennas with their RF front-end circuits. One or more embodiments, such as are described with respect to FIGS. 40-50, are suitable for automatic processes and reduce the number of components involved with packaging antennas.

The ring cavity solution discussed above is quite beneficial, provides high performance, and is relatively easy to implement. However, two issues have been noted with the ring cavity solution. First, the reflectors may restrict or interfere with via implementation. This is particular true for arrays with eight or more elements where many vias are required, so the vias may spread to the reflector region. Second, the apertures on the ground plane will radiate some RF energy to the back side of the package even though the reflectors are used. One or more embodiments, such as the examples depicted in FIGS. 40-50, overcome these two difficulties and further simplify the manufacturing process.

Figure 40:
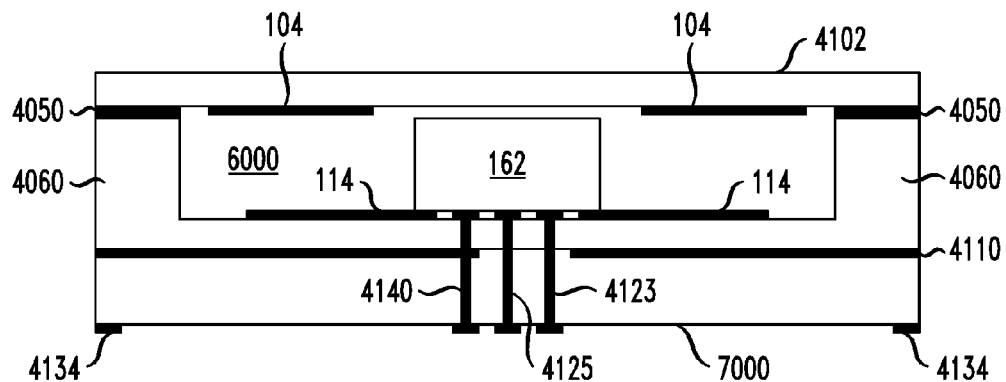
FIGS. 40 and 41 are cross-sectional views of an exemplary embodiment which does not require apertures or reflectors.

As seen in FIG. 40, an exemplary embodiment includes two parts. The main part is a package carrier that holds the RFIC chip 162, provides all the necessary antenna feed lines 114, signal and control lines (for example, via 4125), DC power supply lines (for example, via 4123) and grounding lines (for example, ground via 4140), and interface to the outside of the package (for example, using the external pads on vias 4123, 4125, and 4140 (not separately numbered) as well as additional pads 4134). The main part also includes ground plane 4110 and walls 4060. A cover (or lid) 4102 has all the patches 104 of the patch antennas. The two parts can be glued together or flip-chipped together, as indicated at 4050. Advantageously, the package depicted in FIG. 40 does not have reflectors or apertures on the ground plane 4110. The RF energy is coupled to the patches 104 through electromagnetic coupling (EMC) with proper feed line design or using the stacked patch mechanism. In one or more embodiments, the proper coupling is achieved by adjusting the feed line width, length of the feed line overlapped to the patch above, and the vertical separation distance between the patch and the feed line.

Figure 41:
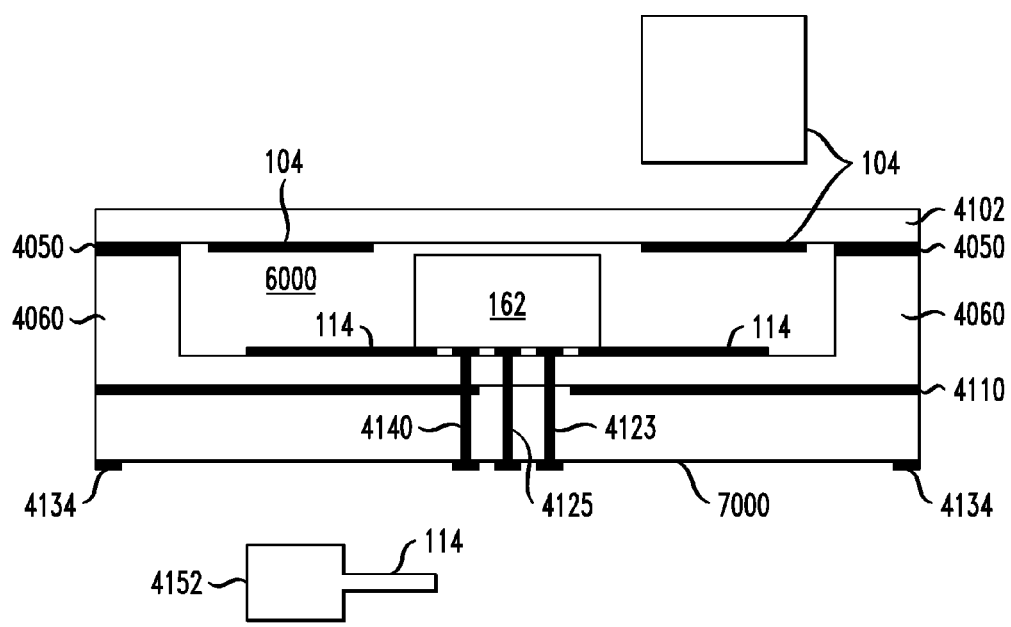

FIG. 41 shows the detail of a non-limiting exemplary feed structure for the package of FIG. 41. The configuration depicted can be considered as an EMC patch antenna or stacked patch antenna. In the latter case, there are patches 4152. Even though a microstrip line is used as feed line 114, the microstrip line can be converted to differential (coplanar strips or CPS) or ground signal ground (GSG or CPW for coplanar waveguide) if the RF chip 162 requires CPS or CPW feed.

Figure 42:
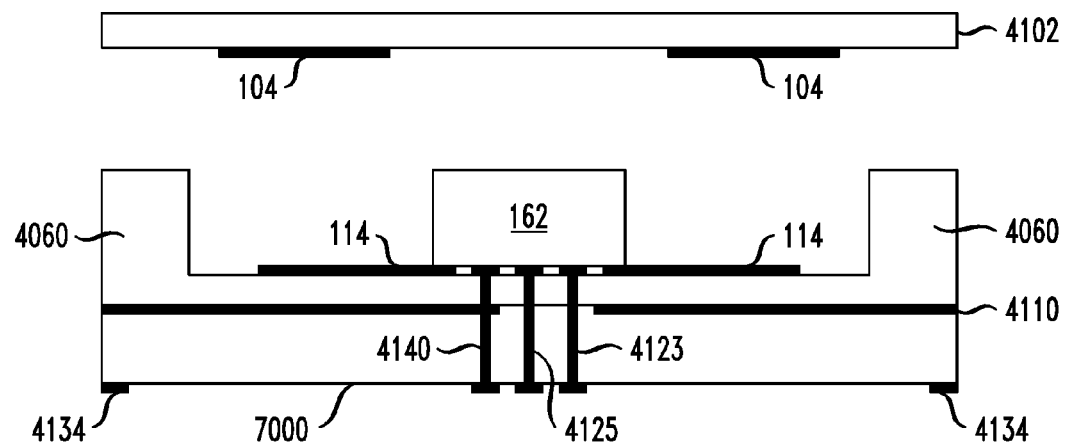
FIGS. 42-45 show non-limiting exemplary techniques to manufacture embodiments similar to that of FIGS. 40 and 41.
Figure 43:
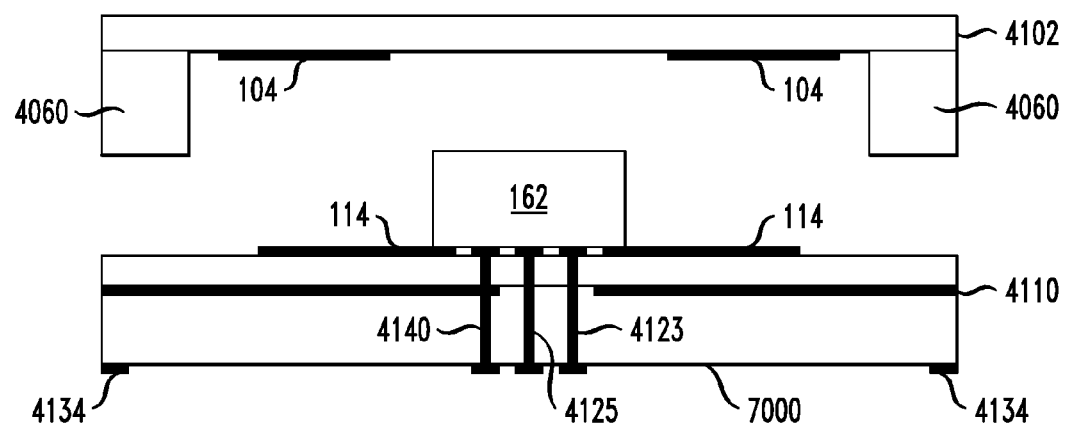
Figure 44:
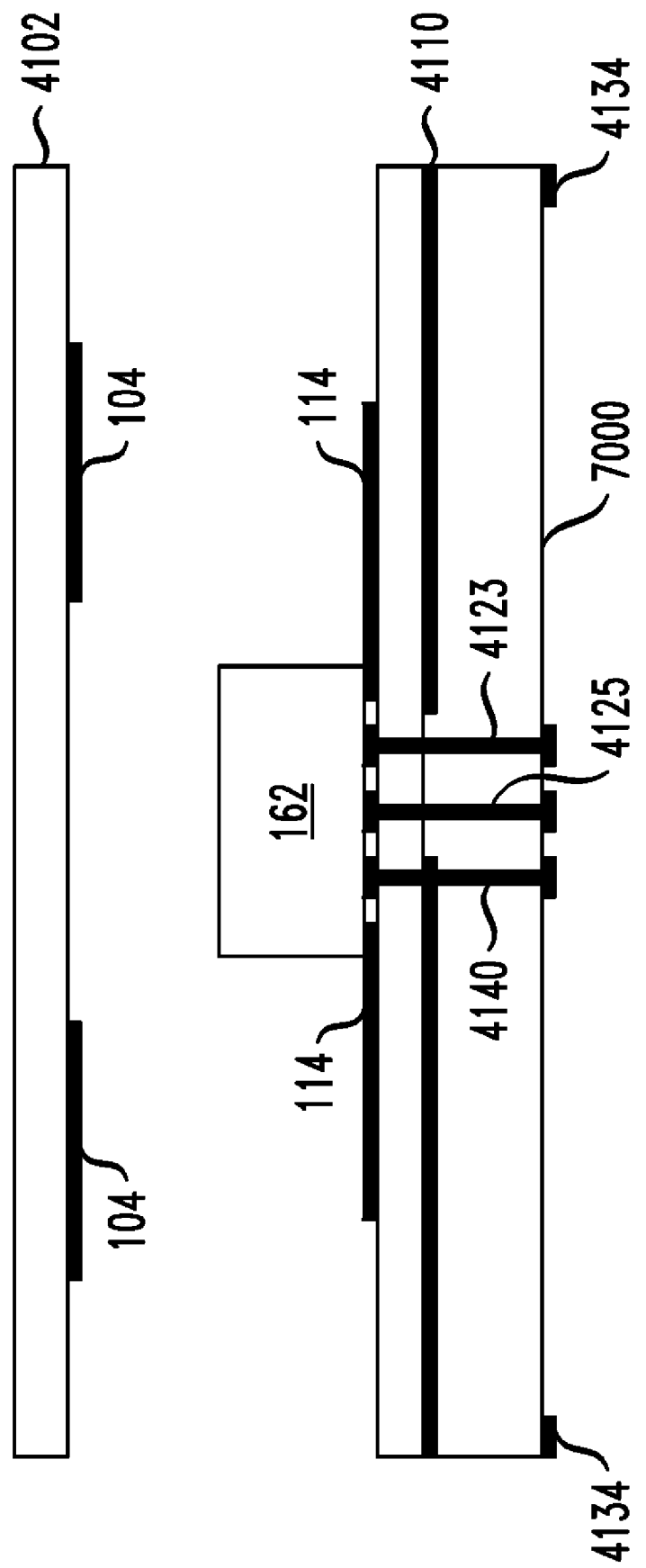
Figure 45:
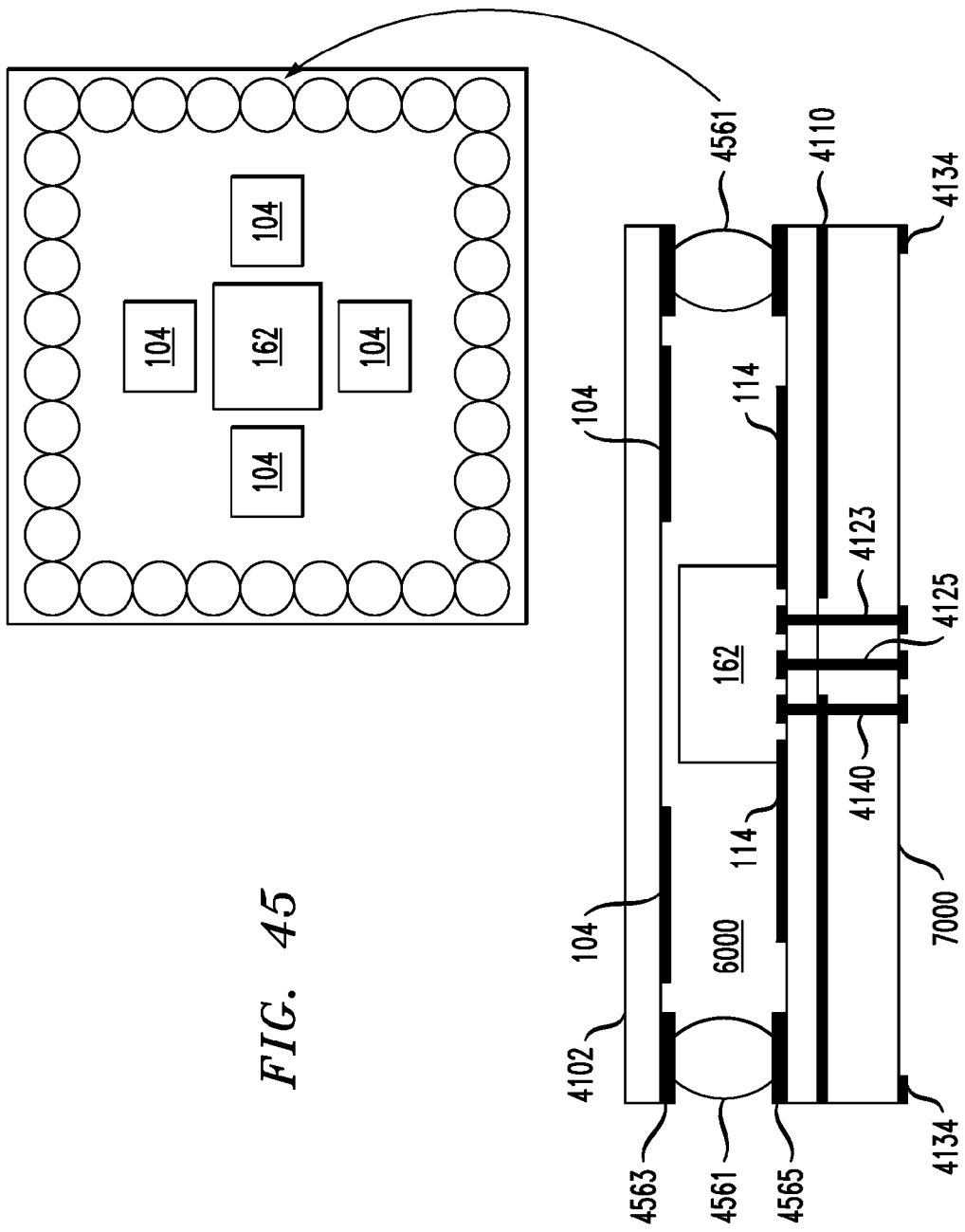

FIGS. 42-44 show three different non-limiting exemplary ways the two package parts can be manufactured, depending on whether package walls such as 4060 are desired. In FIG. 42, walls 4060 are part of the main part, while in FIG. 43, walls 4060 are part of the cover 4102. In the case of FIG. 44 (which omits walls 4060), the two parts can be put together through solder ball attachment or flip-chip attachment as shown in FIG. 45. The skilled artisan will be familiar with such techniques from, for example, Min and Rebeiz (mentioned above), and given the teachings herein, will be able to use same to implement one or more embodiments. The solder balls are labeled 4561. Suitable ball-limiting metallurgy (BLM) pads may be provided on the cover and main part, as indicated at 4563, 4565, respectively.

Figure 46:
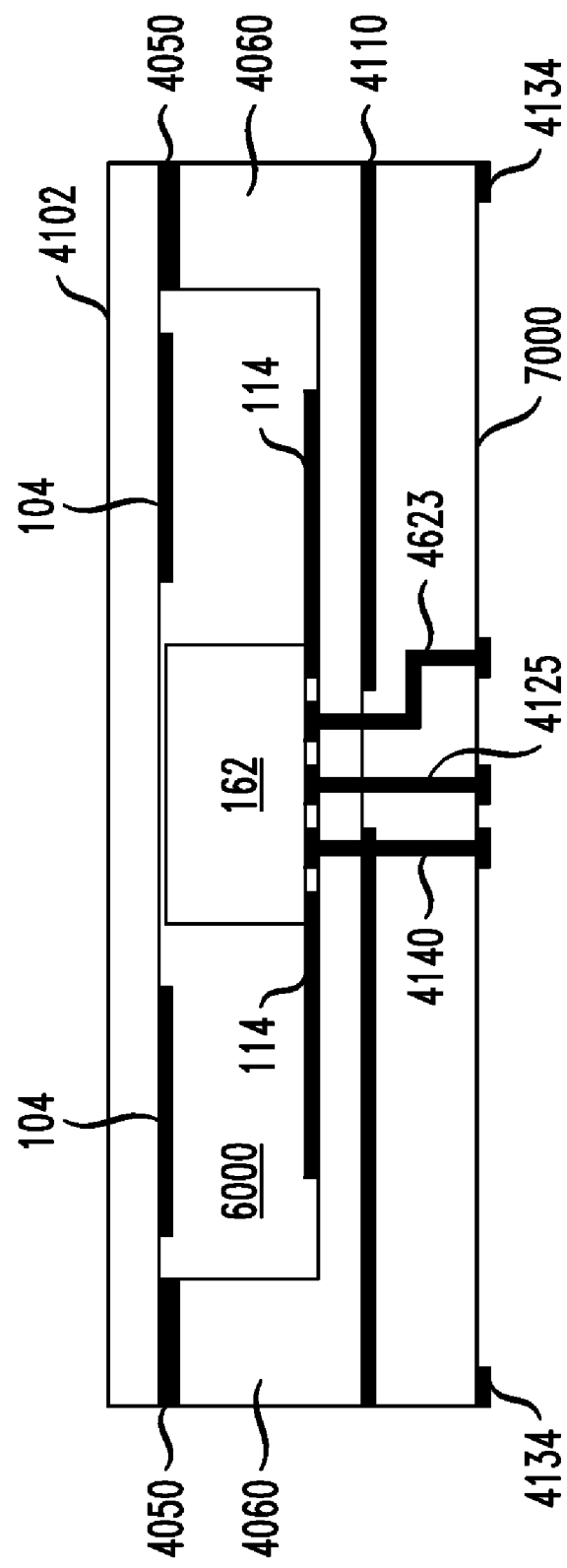
FIG. 46 shows an embodiment similar to that of FIGS. 40 and 41, wherein stepped vias and spread-out pads are provided.

In the event that there are many pads for BGA (ball grid array) attachment of the package to the PCB, especially for large arrays, in at least some cases it will be necessary to spread the pads on the bottom of the package, as show in FIG. 46. This may require stepped vias (power via 4623 is an example of a stepped via). In some embodiments, the vias are spread to reduce manufacturing cost and/or manufacturing difficulties, since larger diameter vias are easy to make. Removing the reflectors will leave room for spreading the vias. In one or more embodiments, there are many advantages to spreading the vias: 1) the interface pads on the bottom of the package and top surface of the PCB are usually very large, so a larger surface area is needed to place all these pads; 2) deep plated through holes (vias) are hard to make, so stepped vias are used to reduce the depth. Step vias per se are quite common in packages and the skilled artisan will be able to adapt same to embodiments of the invention, given the teachings herein.

Figure 47:
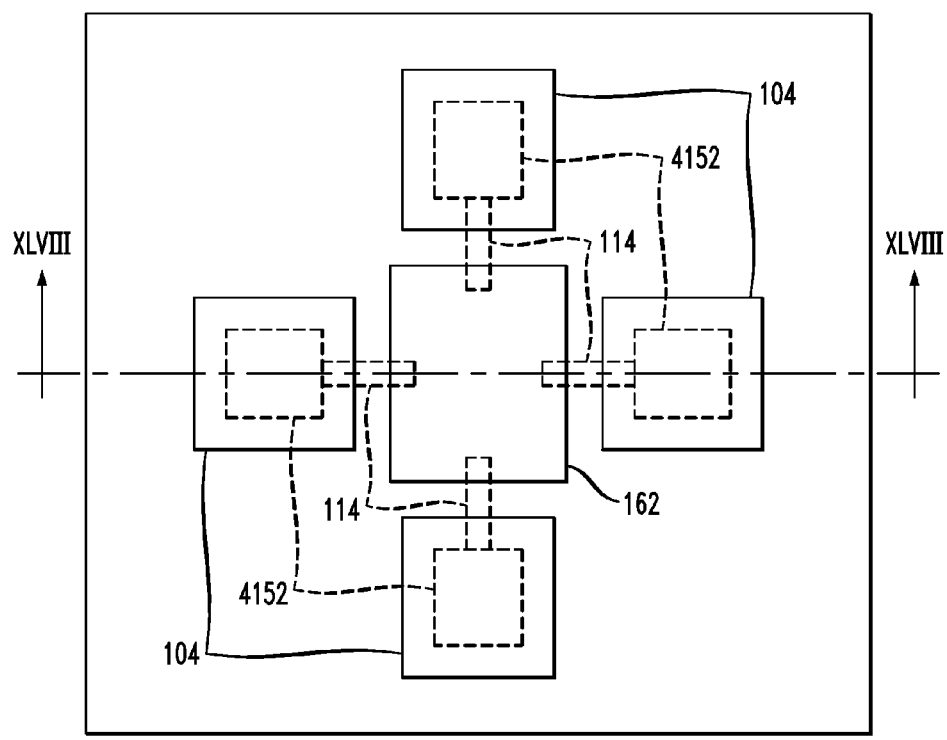
FIG. 47 shows a top view of an exemplary planar phased array using features similar to FIGS. 40 and 41.
Figure 48:
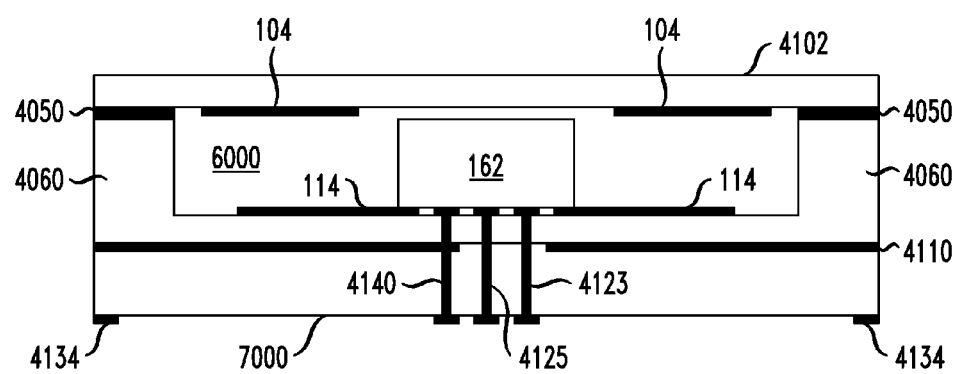
FIG. 48 is a cross-section taken along line XLVIII-XLVIII in FIG. 47.

FIGS. 47 and 48 show, respectively, top and sectional views of an exemplary non-limiting array layout with four antennas. FIG. 48 is a cross section taken along line XLVIII-XLVIII in FIG. 47.

Figure 49:
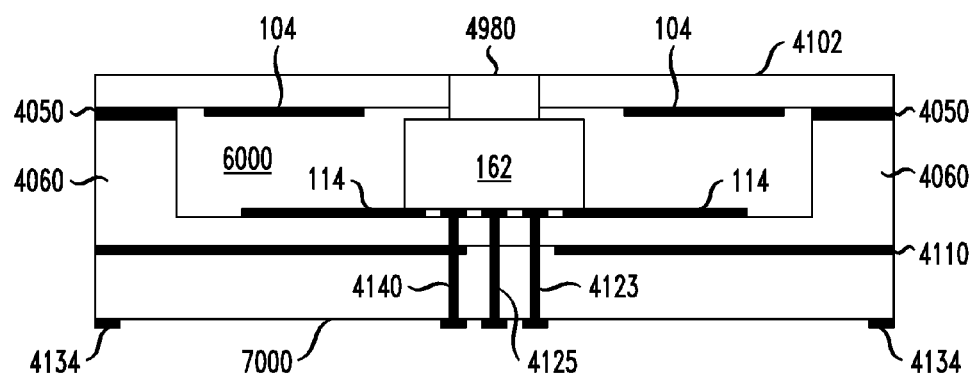
FIG. 49 shows an embodiment similar to that of FIGS. 40 and 41, wherein a heat dissipater is provided.

If the package contains a high powered RFIC such as a transmitter, a heat dissipater 4980 can be attached on the cover 4102 of the package as shown in FIG. 49. Dissipater 4980 can be, for example, attached to the cover and glued to the chip with conductive paste.

Figure 50:
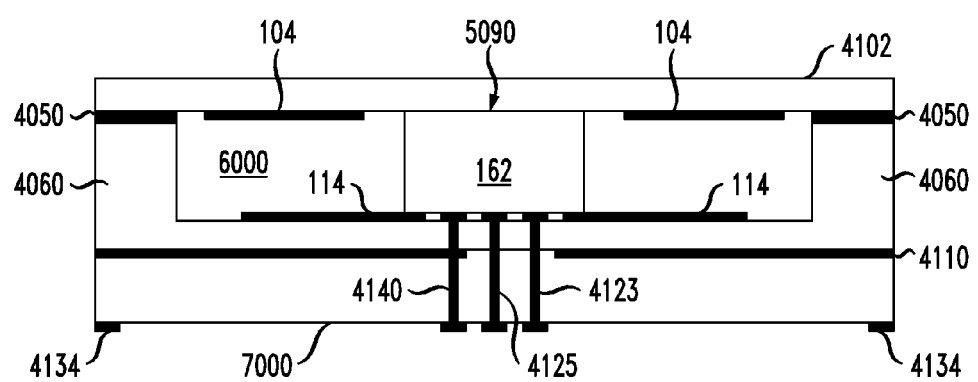
FIG. 50 shows an embodiment similar to that of FIGS. 40 and 41, wherein the chip functions as a structural support for the cover.

In another aspect, it is also possible to use the chip 162 as a support for the cover 4102 to prevent the cover from sagging, as shown at location 5090 in FIG. 50.

Thus, in view of FIGS. 40-50 and accompanying description, it will be appreciated that, in general terms, an exemplary embodiment of a radio-frequency integrated circuit chip package with N integrated patch antennas, N being at least one, includes a cover portion 4102 with N generally planar patches 104, as well as a main portion coupled to the cover portion. The main portion includes at least one generally planar ground plane 4110 spaced inwardly from the N generally planar patches 104 and parallel thereto. The ground plane is formed without any coupling apertures therein. Also included in the main portion are N feed lines 114. The N feed lines are spaced inwardly from the N generally planar patches 104 and parallel thereto. The N feed lines 114 are spaced outwardly from the generally planar ground plane 4110 and parallel thereto.

At least one radio frequency chip 162 is coupled to the feed lines 114 and the ground plane 4110. The cover portion 4102 and the main portion cooperatively define an antenna cavity 6000, and the N generally planar patches 104 and the chip 162 are located in the antenna cavity 6000. The package is formed without reflectors.

Optionally, N is at least two. Cavity 6000 may be, for example, rectangular, circular, ring-shaped, or the like, when viewed in plan. In some instances, as seen in FIG. 43, the cover portion is formed with inward projections (walls 4060) to define the antenna cavity 6000. In other instances, as seen in FIG. 42, the main portion is formed with outward projections (walls 4060) to define the antenna cavity 6000.

As seen in the non-limiting example of FIG. 45, in one or more embodiments, the main portion and the cover portion are formed with opposed ball limiting metallurgy pads 4565, 4563, and the main portion is secured to the cover portion using solder balls 4561 soldered to the ball limiting metallurgy pads, to define the antenna cavity 6000.

Optionally, the N generally planar patches are arranged to form a planar phased array, as seen in FIGS. 47 and 48. The N generally planar patches 104 can be coupled to the feed lines 114 through, for example, electromagnetic coupling; or as seen in FIG. 41, there can be N coupling patches 4152 electrically interconnected with the N feed lines 114 and coplanar therewith, and the N generally planar patches 104 can be coupled to the feed lines 114 through the N coupling patches 4152.

As seen in FIG. 46, in some cases, the main portion and the cover portion 4102 are cooperatively configured such that the chip 162 supports the cover portion 4102 to reduce flexure of the cover portion 4102. As seen in FIG. 49, in some cases, a heat dissipater 4980 is secured to the cover 4102 and is in thermal contact with the chip 162. In some instance, these features are combined; for example, heat dissipater 4980 is secured to the cover portion 4102 and also mechanically supported by chip 162, such that it can also be said in such a case that the main portion and the cover portion are cooperatively configured such that the chip supports the cover portion to reduce flexure of the cover portion.

As seen in FIG. 46, in some instances, at least one via 4623 has (i) a chip-engaging pad (not separately numbered) and (ii) an external pad (not separately numbered) adjacent innermost surface 7000 of the main portion. The at least one via 4623 runs from the chip 162 to the innermost surface 7000 of the main portion, and is stepped such that the external pad is offset from the chip-engaging pad.

Furthermore, in some instances, one or more of the features discussed can be combined. For example, a package could implement a planar phased array, and could implement one or both of the heat dissipater aspect and cover support aspects of FIGS. 49 and 50. Such packages could also include a stepped via as in FIG. 46, and could use electromagnetic coupling or the coupling patches 4152.

With reference again to FIG. 39, flow chart 3900 is also illustrative of an additional exemplary method of fabricating a radio-frequency integrated circuit chip package with N integrated patch antennas, N being at least one, as described with regard to FIGS. 40-50. In this aspect, after beginning at step 3902, steps 3904 and 3906 include providing a cover portion and a main portion as described with respect to FIGS. 40-50, and step 3910 includes securing the cover portion to the main portion. When assembled, the cover portion and the main portion cooperatively define an antenna cavity, and the N generally planar patches and the chip are located in the antenna cavity. An additional possible step includes locating the chip on the main portion such that, when the cover portion is secured to the main portion, the chip is located in the antenna cavity, as represented in the flow chart by step 3908. The parenthetic in block 3908 refers to other embodiments discussed above. Main portions and/or cover portions may be formed, for example, using printed circuit board techniques and/or co-fired ceramic techniques, as indicated by the parenthetic expressions in blocks 3904 and 3906—in other instances, these items could be obtained from elsewhere (also, the chip could, in some instances, be mounted on the main portion by a different entity than the assembler).

In some instances, the main portion and the cover portion are formed with opposed ball limiting metallurgy pads, as shown in FIG. 45, and the securing step 3910 includes securing the cover portion to the main portion using solder balls soldered to the ball limiting metallurgy pads. In one or more embodiments, the main portion includes N coupling patches electrically interconnected with the N feed lines and coplanar therewith, as seen in FIG. 41, and an additional step includes aligning the N generally planar patches with the N coupling patches. This step, not shown in FIG. 39, could be carried out, for example, prior to or simultaneous with the securing step 3910. As seen in FIG. 46, in some cases, the main portion and the cover portion are cooperatively configured such that the chip supports the cover portion to reduce flexure of the cover portion; in this case, securing step 3910 includes securing the cover portion to the main portion with the cover portion supported by the chip. As seen in FIG. 49, in one or more embodiments, the cover portion includes a heat dissipater, and the securing step 3910 includes securing the cover portion to the main portion with the heat dissipater in thermal contact with the chip.

The method continues at block 3912 (for example, one could stop or fabricate more packages). Again, in some embodiments of the method, N is two or more. The N patches can be arranged to form a planar phased array.

Aspects of the invention may be useful in a variety of different applications. For example, in low cost consumer applications with small array size, a package that contains a one-chip module with all the phase shifters and necessary control circuits, and a planar antenna array, can be valuable solution, and can be implemented using techniques set forth herein. One or more embodiments of phased array architecture can be implemented in the thin film technology or printed circuit board (PCB) or LTCC technology. A significant advantage of one or more embodiments is that all antenna elements can be implemented in a planar way and the RFIC module can be packaged with the antenna elements simultaneously. Furthermore, one or more phased array embodiments provide high antenna performance while maintaining easy manufacturability.

Note that, to avoid clutter and confusion, use of hidden (dashed) lines is generally avoided in the top (plan) views herein.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A radio-frequency integrated circuit chip package with N integrated patch antennas, N being at least one, said package comprising:
    a cover portion with N generally planar patches; and
    a main portion coupled to said cover portion, said main portion in turn comprising:
        at least one generally planar ground plane spaced inwardly from said N generally planar patches and parallel thereto, said ground plane being formed without any coupling apertures therein;
        N feed lines, said N feed lines being spaced inwardly from said N generally planar patches and parallel thereto, said N feed lines being spaced outwardly from said generally planar ground plane and parallel thereto; and
        at least one radio frequency chip coupled to said feed lines and said ground plane;
    wherein:
        said cover portion and said main portion cooperatively define an antenna cavity, said N generally planar patches and said chip being located in said antenna cavity; and
        said package is formed without reflectors.

2. The package of claim 1, wherein N is at least two.

3. The package of claim 2, wherein said antenna cavity is rectangular when viewed in plan.

4. The package of claim 2, wherein said antenna cavity is circular when viewed in plan.

5. The package of claim 2, wherein said cover portion is formed with inward projections to define said antenna cavity.

6. The package of claim 2, wherein said main portion is formed with outward projections to define said antenna cavity.

7. The package of claim 2, wherein said main portion and said cover portion are formed with opposed ball limiting metallurgy pads, and said main portion is secured to said cover portion using solder balls soldered to said ball limiting metallurgy pads, to define said antenna cavity.

8. The package of claim 2, wherein said N generally planar patches are arranged to form a planar phased array.

9. The package of claim 2, wherein said N generally planar patches are coupled to said feed lines through electromagnetic coupling.

10. The package of claim 2, further comprising N coupling patches electrically interconnected with said N feed lines and coplanar therewith, wherein said N generally planar patches are coupled to said feed lines through said N coupling patches.

11. The package of claim 2, wherein said main portion and said cover portion are cooperatively configured such that said chip supports said cover portion to reduce flexure of said cover portion.

12. The package of claim 2, further comprising a heat dissipater secured to said cover and in thermal contact with said chip.

13. The package of claim 2, wherein said main portion has an innermost surface, further comprising at least one via with a chip-engaging pad and an external pad, said at least one via running from said chip to said innermost surface of said main portion, said via being stepped such that said external pad is offset from said chip-engaging pad.

14. The package of claim 2, wherein:
    said N generally planar patches are arranged to form a planar phased array;
    said N generally planar patches are coupled to said feed lines through electromagnetic coupling
    said main portion and said cover portion are cooperatively configured such that said chip supports said cover portion to reduce flexure of said cover portion; and
    said main portion has an innermost surface;
    further comprising:
        a heat dissipater secured to said cover and in thermal contact with said chip; and
        at least one via with a chip-engaging pad and an external pad, said at least one via running from said chip to said innermost surface of said main portion, said via being stepped such that said external pad is offset from said chip-engaging pad.

15. The package of claim 2, wherein:
said N generally planar patches are arranged to form a planar phased array;
said main portion and said cover portion are cooperatively configured such that said chip supports said cover portion to reduce flexure of said cover portion; and
said main portion has an innermost surface;
further comprising:
- N coupling patches electrically interconnected with said N feed lines and coplanar therewith, said N generally planar patches being coupled to said feed lines through said N coupling patches;
- a heat dissipater secured to said cover and in thermal contact with said chip; and
- at least one via with a chip-engaging pad and an external pad, said at least one via running from said chip to said innermost surface of said main portion, said via being stepped such that said external pad is offset from said chip-engaging pad.

16. A method of fabricating a radio-frequency integrated circuit chip package with N integrated patch antennas, N being at least one, said method comprising the steps of:
providing a cover portion with N generally planar patches;
providing a main portion comprising:
- at least one generally planar ground plane, said ground plane being formed without any coupling apertures therein;
- N feed lines, said N feed lines being spaced outwardly from said generally planar ground plane and parallel thereto; and
- at least one radio frequency chip coupled to said feed lines and said ground plane; and
securing said cover portion to said main portion;
wherein:
said cover portion and said main portion cooperatively define an antenna cavity, said N generally planar patches and said chip being located in said antenna cavity;
said N feed lines are spaced inwardly from said N generally planar patches and parallel thereto; and
said package is formed without reflectors.

17. The method of claim 16, wherein N is at least two.

18. The method of claim 17, further comprising the additional step of locating said chip on said main portion such that, when said cover portion is secured to said main portion, said chip is located in said antenna cavity.

19. The method of claim 17, further comprising the additional step of forming at least said main portion using printed circuit board techniques.

20. The method of claim 17, further comprising the additional step of forming at least said main portion using low temperature co-fired ceramic techniques.

21. The method of claim 17, wherein said main portion and said cover portion are formed with opposed ball limiting metallurgy pads, and wherein said securing step comprises securing said cover portion to said main portion using solder balls soldered to said ball limiting metallurgy pads.

22. The method of claim 17, wherein said main portion further comprises N coupling patches electrically interconnected with said N feed lines and coplanar therewith, further comprising aligning said N generally planar patches with said N coupling patches.

23. The method of claim 17, wherein said main portion and said cover portion are cooperatively configured such that said chip supports said cover portion to reduce flexure of said cover portion, and wherein said securing step comprises securing said cover portion to said main portion with said cover portion supported by said chip.

24. The method of claim 17, wherein said cover portion further comprises a heat dissipater, and wherein said securing step comprises securing said cover portion to said main portion with said heat dissipater in thermal contact with said chip.

* * * * *